(12) United States Patent
Park et al.

(10) Patent No.: US 10,301,541 B2
(45) Date of Patent: May 28, 2019

(54) FLUORIDE PHOSPHOR, METHOD OF MANUFACTURING THE SAME, AND LIGHT EMITTING DEVICE

(71) Applicant: SAMSUNG ELECTRONICS CO., LTD., Suwon-si (KR)

(72) Inventors: Jong Won Park, Seoul (KR); Woon Seok Kim, Suwon-si (KR); Tae Hoon Kim, Suwon-si (KR); Ji Ho You, Seoul (KR); Chul Soo Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 229 days.

(21) Appl. No.: 15/075,311

(22) Filed: Mar. 21, 2016

(65) Prior Publication Data
US 2017/0009132 A1  Jan. 12, 2017

(30) Foreign Application Priority Data
Jul. 6, 2015 (KR) ........................ 10-2015-0096123

(51) Int. Cl.
*C09K 11/61* (2006.01)
*C09K 11/02* (2006.01)

(52) U.S. Cl.
CPC .......... *C09K 11/617* (2013.01); *C09K 11/025* (2013.01); *H01L 2933/0041* (2013.01)

(58) Field of Classification Search
CPC .................................................. C09K 11/617
See application file for complete search history.

(56) References Cited

U.S. PATENT DOCUMENTS

| | | | |
|---|---|---|---|
| 6,346,326 B1 | 2/2002 | Yocom | |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,001,665 B2 | 2/2006 | Klinedinst | |
| 7,002,182 B2 | 2/2006 | Okuyama et al. | |

(Continued)

FOREIGN PATENT DOCUMENTS

| | | |
|---|---|---|
| JP | 2007-63366 A | 3/2007 |
| JP | 2013-213094 A | 10/2013 |

(Continued)

*Primary Examiner* — Matthew E. Hoban
(74) *Attorney, Agent, or Firm* — Sughrue Mion, PLLC

(57) ABSTRACT

A fluoride phosphor includes fluoride particles represented by $A_xMF_y{:}Mn_z^{4+}$ where A is at least one selected from lithium (Li), sodium (Na), potassium (K), rubidium (Rb), and cesium (Cs), M is at least one selected from silicon (Si), titanium (Ti), zirconium (Zr), hafnium (Hf), germanium (Ge) and tin (Sn), a compositional ratio x of A satisfies $2 \leq x \leq 3$, and a compositional ratio y of F satisfies $4 \leq y \leq 7$; and an organic material physically adsorbed onto surfaces of the fluoride particles to allow the fluoride particles to have hydrophobicity. The fluoride particles have a concentration of $Mn^{4+}$ gradually reduced from respective centers to respective surfaces of the fluoride particles.

20 Claims, 13 Drawing Sheets

(56) References Cited

U.S. PATENT DOCUMENTS

| | | |
|---|---|---|
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,497,973 B2 | 3/2009 | Radkov et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,057,706 B1 | 11/2011 | Setlur et al. |
| 8,129,711 B2 | 3/2012 | Kang et al. |
| 8,179,938 B2 | 5/2012 | Kim |
| 8,252,613 B1 | 8/2012 | Lyons et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,491,816 B2 | 7/2013 | Hong et al. |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,801,968 B2 | 8/2014 | Petry et al. |
| 2010/0259156 A1 | 10/2010 | Winkler et al. |
| 2011/0147664 A1* | 6/2011 | Lyons ............... C09K 11/025 252/301.36 |
| 2015/0008463 A1* | 1/2015 | Yoshida ............ C09K 11/675 257/98 |
| 2015/0263245 A1* | 9/2015 | Akagawa ........... C09K 11/617 257/88 |
| 2016/0111610 A1* | 4/2016 | Ota ................. H01L 21/02601 257/89 |

FOREIGN PATENT DOCUMENTS

| | | |
|---|---|---|
| JP | 5446511 B2 | 3/2014 |
| JP | 5545665 B2 | 7/2014 |
| WO | 2009/119486 A1 | 10/2009 |

* cited by examiner

FLUORIDE PHOSPHOR, METHOD OF MANUFACTURING THE SAME, AND LIGHT EMITTING DEVICE

CROSS-REFERENCE TO RELATED APPLICATION

This application claims the priority and benefit of Korean Patent Application No. 10-2015-0096123, filed on Jul. 6, 2015, in the Korean Intellectual Property Office, the disclosure of which is incorporated herein by reference.

BACKGROUND

Apparatuses and methods consistent with exemplary embodiments relate to a fluoride phosphor, a method of manufacturing the same, and a light emitting device.

Semiconductor light emitting devices emit light using the principle of the recombination of electrons and holes when a current is applied thereto. Semiconductor light emitting devices have been widely used as light sources due to various inherent positive characteristics thereof, such as low power consumption, a high degree of brightness, miniaturizability, and the like. In particular, after the development of nitride-based light emitting devices, a utilization range thereof has been further increased and used in backlight units, home lighting devices, vehicle lighting devices, and the like.

Light emitting devices using semiconductor light emitting devices as described above include light emitting elements providing excitation light, and phosphors exciting light emitted by the light emitting elements to have a converted wavelength, such that desired color characteristics may be obtained. Thus, phosphors providing excellent color reproduction while having reliability and the like, as well as light emitting devices using such phosphors, have been in demand.

SUMMARY

An aspect of the present inventive concept may provide a fluoride phosphor having improved reliability and a method of manufacturing the same.

An aspect of the present inventive concept may also provide a light emitting device having improved reliability by incorporating the fluoride phosphor described above.

According to an aspect of an exemplary embodiment, a fluoride phosphor may include fluoride particles represented by $A_xMF_y:Mn_z^{4+}$ where A is at least one selected from lithium (Li), sodium (Na), potassium (K), rubidium (Rb), and cesium (Cs), M is at least one selected from silicon (Si), titanium (Ti), zirconium (Zr), hafnium (Hf), germanium (Ge) and tin (Sn), a compositional ratio x of A satisfies 2≤x≤3, and a compositional ratio y of F satisfies 4≤y≤7; and an organic material physically adsorbed onto surfaces of the fluoride particles to allow the fluoride particles to have hydrophobicity. The concentration of $Mn^{4+}$ in the fluoride particles may be gradually reduced from respective centers to respective surfaces of the fluoride particles.

An average concentration reduction rate of $Mn^{4+}$ from the centers to the surfaces of the fluoride particles may be within a range of about 0.4 at. %/μm to about 0.8 at. %/μm.

The fluoride particles may have a concentration of about 3 at. % to about 5 at. % of $Mn^{4+}$ in centers thereof.

The fluoride particles may have a concentration difference of about 2 at. % to about 4 at. % between the centers and the surfaces of the fluoride particles.

An average particle size (D50) of the fluoride particles may be within a range of about 5 μm to about 25 μm.

The organic material may comprise a fatty acid.

The organic material may comprise an oleic acid.

The fluoride particle may be $K_2SiF_6:Mn_z^{4+}$.

According to an aspect of an exemplary embodiment, a light emitting device may include a light emitting element, and a wavelength conversion unit absorbing excitation light emitted by the light emitting element to emit visible light. The wavelength conversion unit may include fluoride particles represented by $A_xMF_y:Mn_z^{4+}$ where A is at least one selected from lithium (Li), sodium (Na), potassium (K), rubidium (Rb), and cesium (Cs), M is at least one selected from silicon (Si), titanium (Ti), zirconium (Zr), hafnium (Hf), germanium (Ge) and tin (Sn), a compositional ratio x of A satisfies 2≤x≤3, and a compositional ratio y of F satisfies 4≤y≤7; and an organic material physically adsorbed onto surfaces of the fluoride particles to allow the fluoride particles to have hydrophobicity. The fluoride particles may have a concentration of $Mn^{4+}$ that is gradually reduced from respective centers to respective surfaces of the fluoride particles.

The wavelength conversion unit may further include a green phosphor absorbing light emitted by the light emitting element to emit green light.

According to an aspect of an exemplary embodiment, a method of manufacturing a fluoride phosphor represented by Formula 1 below may include preparing a first solution including a first raw material containing M and a manganese compound, forming precipitates by sequentially providing a second solution including a second raw material containing A and the first raw material to the first solution, collecting the precipitates, preparing a third solution by providing the first raw material and a hydrofluoric acid solution to the precipitates, and forming fluoride particles by providing the second solution to the third solution, $$A_xMF_y:Mn_z^{4+} \qquad \text{[Formula 1]}$$

where A is at least one selected from lithium (Li), sodium (Na), potassium (K), rubidium (Rb), and cesium (Cs), M is at least one selected from silicon (Si), titanium (Ti), zirconium (Zr), hafnium (Hf), germanium (Ge) and tin (Sn), a compositional ratio x of A satisfies 2≤x≤3, and a compositional ratio y of F satisfies 4≤y≤7.

The first raw material provided in the forming of the precipitates may react with $A^+$ and $Mn^{4+}$ remaining after a reaction between the first solution and the second solution.

In the forming of the fluoride particles, the second raw material of the second solution may react with $Mn^{4+}$ remaining in the precipitates.

The precipitates may be collected to remove $Mn^{4+}$ present in a solution including the precipitates.

The method of manufacturing a fluoride phosphor may further include washing the fluoride particles, and providing the washed fluoride particles to an organic solvent to allow an organic material to be physically adsorbed onto surfaces of the fluoride particles.

A molar ratio of the fluoride particles and the organic material may be within a range of 1:1 to 1:1.5.

The organic material may comprise an oleic acid.

The method of manufacturing a fluoride phosphor may further include drying the fluoride particles and performing a heat treatment of the fluoride particles, after the fluoride particles are washed.

In the forming of the precipitates and the fluoride particles, the second solution may be respectively provided to the first solution and the third solution a plurality of times.

The second solution may be provided a plurality of times to sequentially form fluoride seeds, allow the fluoride seeds to grow, and induce precipitation of the grown fluoride seeds.

A volume of the first raw material provided in forming the precipitates may be within a range of about 15% to about 25% of a volume of the first raw material contained in the first solution.

A weight of the second raw material in the second solution provided to the third solution may be within a range of about 40% to about 60% of a weight of the second raw material in the second solution provided to the first solution.

The manganese compound may contain a manganese compound having a composition of $A_xMnF_y$.

The first raw material may include at least one of $H_xMF_y$, $A_xMF_y$, and $MO_2$, and the second raw material may include $AHF_2$.

According to an aspect of an exemplary embodiment, a method of manufacturing a fluoride phosphor represented by Formula 1 below may include preparing a first solution including a first raw material containing M and a manganese compound, forming fluoride particles by providing a second solution including a second raw material containing A to the first solution, growing the fluoride particles by providing the first raw material to a mixed solution of the first solution and the second solution, collecting the fluoride particles, preparing a third solution by providing the first raw material and a hydrofluoric acid solution to the fluoride particles, and growing the fluoride particles by providing the second solution to the third solution,

[Formula 1]

$$A_xMF_y:Mn_z^{4+} \quad \text{Formula 1}$$

where A is at least one selected from lithium (Li), sodium (Na), potassium (K), rubidium (Rb), and cesium (Cs), M is at least one selected from silicon (Si), titanium (Ti), zirconium (Zr), hafnium (Hf), germanium (Ge) and tin (Sn), a compositional ratio x of A satisfies $2 \leq x \leq 3$, and a compositional ratio y of F satisfies $4 \leq y \leq 7$. The fluoride particles may have a concentration of $Mn^{4+}$ gradually reduced while being grown.

According to an aspect of an exemplary embodiment a method of manufacturing a fluoride phosphor is provided. The method includes: preparing a first solution including a first raw material comprising M and a manganese compound, combining the first solution with a second solution comprising A and the first raw material, collecting precipitates formed by the combining, preparing a third solution by combining the first raw material and a hydrofluoric acid solution with the precipitates, and forming fluoride particles by combining the second solution with the third solution. The fluoride phosphor is represented by the formula AxMFy:Mnz4+, where A is at least one selected from lithium (Li), sodium (Na), potassium (K), rubidium (Rb), and cesium (Cs), M is at least one selected from silicon (Si), titanium (Ti), zirconium (Zr), hafnium (Hf), germanium (Ge) and tin (Sn), a compositional ratio x of A satisfies $2 \leq x \leq 3$, and a compositional ratio y of F satisfies $4 \leq y \leq 7$.

The first raw material may be at least one of HxMFy, AxMFy and MO2, and the second raw material may be AHF2.

The manganese compound may be a manganese compound having a composition of AxMnFy.

The method may further include washing the fluoride particles; and combining the washed fluoride particles with an organic solvent so that organic material is physically adsorbed onto surfaces of the fluoride particles.

The method may further include drying the fluoride particles; and performing a heat treatment of the fluoride particles.

BRIEF DESCRIPTION OF DRAWINGS

The above and other aspects, features and other advantages will be more clearly understood from the following detailed description taken in conjunction with the accompanying drawings, in which.

DETAILED DESCRIPTION OF EXEMPLARY EMBODIMENTS

Figure 1:
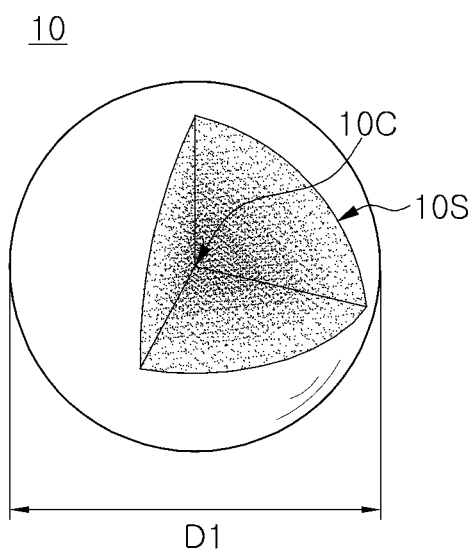
FIG. 1 is a partially cutaway perspective view schematically illustrating a fluoride phosphor particle according to an exemplary embodiment.

Hereinafter, exemplary embodiments will be described in detail with reference to the accompanying drawings.

The disclosure may, however, be embodied in many different forms and should not be construed as being limited to the exemplary embodiments set forth herein. Rather, these exemplary embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Fluoride Phosphor and Method of Manufacturing the Same

FIG. 1 is a partially cutaway perspective view schematically illustrating a fluoride phosphor particle according to an exemplary embodiment.

Referring to FIG. 1, a fluoride phosphor particle 10 according to an exemplary embodiment may contain a fluoride represented by $A_xMF_y$:$Mn^{4+}$ that may satisfy the following conditions.

1) A is at least one selected from lithium (Li), sodium (Na), potassium (K), rubidium (Rb), and cesium (Cs);
2) M is at least one selected from silicon (Si), titanium (Ti), zirconium (Zr), hafnium (Hf), germanium (Ge) and tin (Sn);
3) A compositional ratio x of A satisfies $2 \leq x \leq 3$; and
4) A compositional ratio y of F satisfies $4 \leq y \leq 7$.

The fluoride phosphor particle 10 represented by the empirical formula $A_xMF_y$:$Mn^{4+}$ may include $K_2SiF_6$:$Mn^{4+}$, $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $K_3SiF_7$:$Mn^{4+}$, $K_3ZrF_7$:$Mn^{4+}$ and $K_3SiF_5$:$Mn^{4+}$. The fluoride phosphor particle 10 may be excited by a wavelength of light between an ultraviolet region to a blue region of the electromagnetic spectrum to emit red light. For example, the fluoride phosphor particle 10 may provide a red phosphor absorbing excitation light having a peak wavelength in a range of 300 nm to 500 nm to emit light having a peak wavelength in a range of 620 nm to 640 nm.

The fluoride phosphor particle 10 may have a $Mn^{4+}$ activator concentration gradually reduced from a center 10C thereof to a surface 10S thereof. In the present disclosure, the term "gradually reducing" is used to indicate that a concentration is continuously reduced without a portion of the fluoride phosphor particle 10 in which the concentration is uniformly maintained at a predetermined thickness or more. For example, the fluoride phosphor particle 10 may not have a uniform concentration of $Mn^{4+}$ within a region thereof exceeding 10% of a particle size D1 in a direction from the center 10C of the fluoride phosphor particle 10 to the surface 10S of the fluoride phosphor particle 10. An average reduction rate of $Mn^{4+}$ concentration, for example, in an overall thickness of the fluoride phosphor particle 10, may be about 0.4 at. %/μm to about 0.8 at. %/μm. However, the concentration reduction rate, with respect to an overall thickness thereof, may not be uniform. For example, the reduction rate of $Mn^{4+}$ concentration from the center 10C of the fluoride phosphor particle 10 to the surface 10S thereof may be within a range of about 0.1 at. %/μm to about 1.5 at. %/μm according to a region of the fluoride phosphor particle 10.

The $Mn^{4+}$ concentration may be about 3 at. % to about 5 at. % in the center 10C of the fluoride phosphor particle 10, and may be about 1.5 at. % or below on the surface 10S of the fluoride phosphor particle 10. A difference in $Mn^{4+}$ concentration between the center 10C and the surface 10S of the fluoride phosphor particle 10 may be within a range of about 2 at. % to about 4 at. %.

The particle size D1 of the fluoride phosphor particle 10 may be within a range of 5 μm to 25 μm.

Since the fluoride phosphor particle 10 according to the exemplary embodiment has a composition in which the $Mn^{4+}$ concentration is reduced toward the surface 10S thereof, vulnerability of the fluoride phosphor particle 10 to moisture may be reduced and increased reliability may be secured.

Figure 2:
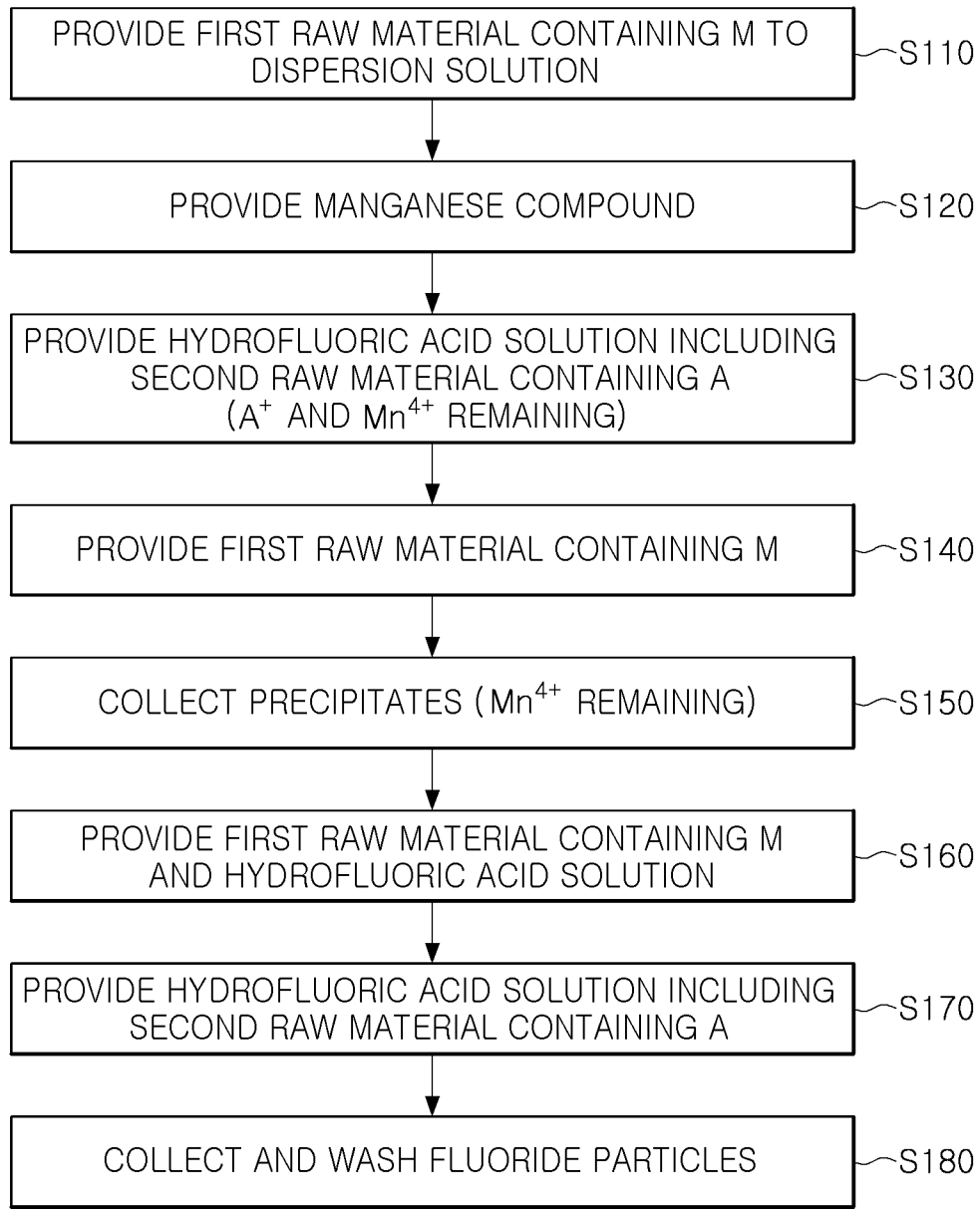
FIG. 2 is a flowchart illustrating a method of manufacturing a fluoride phosphor according to an exemplary embodiment.

FIG. 2 is a flowchart illustrating a method of manufacturing a fluoride phosphor according to an exemplary embodiment.

With reference to FIG. 2, a method of manufacturing a fluoride phosphor may include providing a first raw material containing M to a hydrofluoric acid solution (operation S110), providing a manganese compound (operation S120), providing a hydrofluoric acid solution including a second raw material containing A (operation S130), providing a first raw material containing M (operation S140), collecting formed precipitates (operation S150), providing the first raw material containing M and a hydrofluoric acid solution (operation S160), providing a hydrofluoric acid solution including the second raw material containing A (operation S170), and collecting and washing fluoride particles (operation S180).

These operations may be performed at room temperature, but are not limited thereto.

First, the first raw material containing M may be added to the hydrofluoric acid solution in operation S110. The first raw material may be at least one of $H_xMF_y$, $A_xMF_y$, and $MO_2$, and for example, may be $H_2SiF_6$ or $K_2SiF_6$. The first raw material may be added to the hydrofluoric acid solution, and then stirred for several minutes so as to appropriately dissolve therein.

Subsequently, the manganese compound may be added to above solution in operation S120.

Thereby, a first solution containing the first raw material containing M and the manganese compound may be produced.

The manganese compound may be a compound containing $Mn^{4+}$, and for example, may have a composition of $A_xMnF_y$. For example, the manganese compound may be $K_2MnF_6$. In a manner similar to that of operation S110, the manganese compound may be provided to the hydrofluoric acid solution in which the first raw material dissolved and may be stirred to sufficiently dissolve therein.

Although an exemplary embodiment illustrates the case in which the first raw material containing M and the manganese compound are sequentially added to the hydrofluoric acid solution, the first solution may be produced in different order therefrom. For example, in another exemplary embodiment, after the manganese compound is first provided to the hydrofluoric acid solution, the first raw material containing M may be provided thereto.

Next, the hydrofluoric acid solution including the second raw material containing A may be provided in operation S130.

In detail, a second solution including the second raw material containing A may be provided to the first solution. The second raw material may be $AHF_2$, for example, $KHF_2$, and may be in a saturation solution state or powder form.

As the respective raw material concentrations approach a solubility limit of the hydrofluoric acid solution, precipitates having an orange color may be formed. The precipitates may be $Mn^{4+}$-activated fluoride ($A_xMF_y$:$Mn^{4+}$). For example, when $H_2SiF_6$ and $KHF_2$ are used as the first and second raw materials, and $K_2MnF_6$ is used as $Mn^{4+}$-containing compound, the precipitates may be fluoride represented by $K_2SiF_6$:$Mn^{4+}$.

In operation S130, $A^+$ and $Mn^{4+}$ not reacted may remain with the precipitates in the solution.

In operation S130, an amount of the second raw material may be divided and added at an interval corresponding to a time required for reaction thereof, such that a particle size of fluoride may be adjusted. An average particle size and a particle size distribution may be controlled by adjusting an addition number, an addition amount, an addition interval, and the like. For example, when the second raw material is divided 4 times and provided, fluoride seeds may be formed by a primarily-added second raw material, and the seeds may be grown by a secondarily and thirdly added second raw material, and precipitation of the grown seeds may be induced by a fourthly added second raw material.

Subsequently, the first raw material containing M may be added to above solution in operation S140.

The first raw material may be the same material as the material used in operation S110, but is not limited thereto. The first raw material may be at least one of $H_xMF_y$ and $A_xMF_y$, and for example, may be $H_2SiF_6$ or $K_2SiF_6$. The first raw material may be added to the solution, and then, may be stirred for several minutes so as to appropriately dissolve therein.

In operation S140, the added first raw material may react with $A^+$ and $Mn^{4+}$ remaining in the solution described above to allow the precipitates to grow. Thus, in a region formed at this stage, operation S140, a $Mn^{4+}$ concentration may be relatively low. For example, in a case in which $K_2SiF_6$:$Mn^{4+}$ is synthesized in operation S130, when a $H_2SiF_6$ solution is additionally supplied in operation S140, the $H_2SiF_6$ solution reacts with residual $KHF_2$ and $Mn^{4+}$ to create $K_2SiF_6$ and be grown in a shell form on a surface of the fluoride formed in operation S130.

Although the exemplary embodiment illustrates the case in which the second raw material remains after operation S130, the first raw material may remain. In this case, the second raw material containing A may be additionally provided other than providing the first raw material, in operation S140.

An amount of the first raw material provided in operation S140 may be smaller than that of the first raw material provided to the first solution in operation S110, and for example, a volume thereof may be within a range of 15% to 25%.

Subsequently, the formed precipitates may be collected in operation S150.

The precipitates may be precipitates having started to precipitate in operation S130, and $Mn^{4+}$ remaining on a surface of the precipitates may also be collected. On the other hand, the second raw material such as $A^+$ may be almost entirely consumed in operation S140 and thus may not remain.

In operation S150, hydrofluoric acid may be removed, and the precipitates may be collected, such that $Mn^{4+}$ remaining in the hydrofluoric acid solution may be removed together therewith. Thus, since only a small amount of $Mn^{4+}$ remaining on surface of the precipitates may be used at the time of reaction of a subsequent process, a $Mn^{4+}$ concentration in a phosphor region grown subsequently may be further decreased. Next, the first raw material containing M and the hydrofluoric acid solution may be added to the precipitates in operation S160. Whereby, a third solution may be produced.

The first raw material may be the same material as the material used in operations S110 and S140, but is not limited thereto.

An amount of the first raw material provided in operation S160 may be smaller than that of the first raw material provided to the first solution in operation S110, and for example, a volume thereof may be within a range of 15% to 25%.

Subsequently, the hydrofluoric acid solution including the second raw material containing A may be provided to the third solution in operation S170.

For example, the second solution, the hydrofluoric acid solution including the second raw material containing A, may be re-provided to the third solution. The second solution may contain the same second raw material as that used in operation S130, but is not limited thereto. In operation S170, an amount of the second raw material may be divided and provided at an interval corresponding to a time required for reaction thereof, such that a particle size of a fluoride particle to be formed may be controlled.

The amount of the second raw material used in operation S170 may be smaller than that of the second raw material provided to the first solution in operation S130, and for example, a weight thereof may be within a range of 40% to 60%.

The second raw material may react with $Mn^{4+}$ remaining together with the precipitates and the first raw material within the third solution and be formed in a shell form on the fluorides precipitates such that fluoride particles are formed. In order to be discernable from the precipitates formed in operation S150, a final phosphor particle formed in operation S170 may be referred to as a fluoride particle for convenience of explanation, but a fluoride phosphor according to an exemplary embodiment may include a fluoride material that is grown from the precipitates and is finally formed in operation S170, but is not limited to a name referred in respective operations.

Subsequently, fluoride particles may be collected and washed in operation S180.

The washing process may be performed using a hydrofluoric acid solution and/or an acetone solution as a washing solution. The washing process may be performed by stirring the precipitates using, for example, about 49% of high concentration hydrofluoric acid aqueous solution, and thus, impurities present on the fluoride particles and residual first and second raw materials and the like may be removed. In an exemplary embodiment, the washing process may also be performed a plurality of times using different washing solutions.

Then, a fluoride phosphor according to an exemplary embodiment may be obtained by drying washed fluoride particles. Selectively, the fluoride particles may be dried, and then, a heat treatment process at about 100° C. to about 150° C. may further be performed.

The fluoride phosphor in which a content of manganese is gradually reduced toward a surface thereof may be produced through the processes as described above. In the exemplary embodiment, a manganese compound containing $Mn^{4+}$ may be provided once in operation S120, and the number of inputs and an input amount of the first and second raw materials may be adjusted, such that phosphor particles may be grown in an environment in which a $Mn^{4+}$ concentration is continuously reduced.

Figure 3:
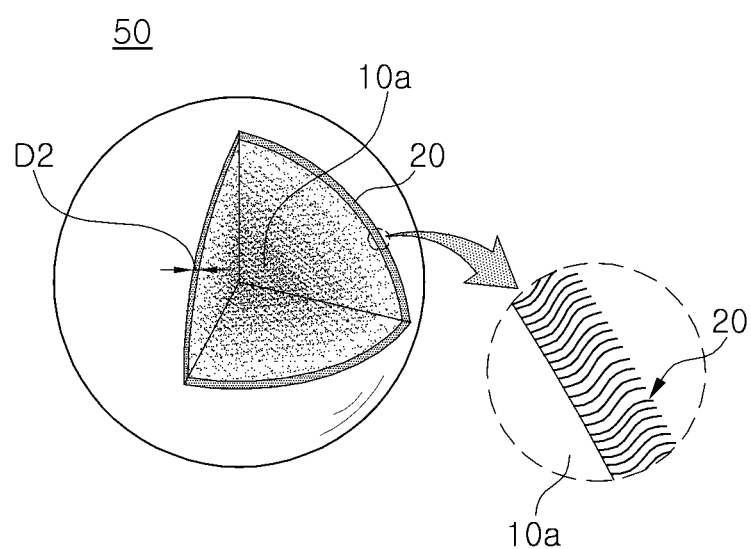
FIG. 3 is a partially cutaway perspective view schematically illustrating a fluoride phosphor particle according to an exemplary embodiment.

FIG. 3 is a partially cutaway perspective view schematically illustrating a fluoride phosphor particle according to an exemplary embodiment of the present inventive concept.

With reference to FIG. 3, a fluoride phosphor particle 50 according to an exemplary embodiment may include a fluoride particle 10a represented by $A_xMF_y$:$Mn^{4+}$ and organic materials 20 adsorbed onto a surface of the fluoride particle 10a.

The fluoride particle 10a may be a core of the fluoride phosphor particle 50 and may have the same configuration as the fluoride phosphor particle 10 of the exemplary embodiment of FIG. 1. Thus, the fluoride particle 10a may have a composition in which a concentration of $Mn^{4+}$ is gradually reduced from a center thereof to a surface thereof. For instance, the fluoride phosphor particle 50 may have a structure in which organic materials 20 are added to the fluoride phosphor particle 10 of the exemplary embodiment of FIG. 1.

The organic materials 20 may be physically adsorbed onto a surface of the fluoride particle 10a to protect the fluoride particle 10a. The organic materials 20 may be materials having a hydrophobic tail. Thus, a surface of the fluoride phosphor particle 50 may have hydrophobicity to have further increased moisture resistance.

For example, the organic materials 20 may have at least one functional group between a carboxylic group (—COOH) and an amino group (—NH$_2$), and may include an organic compound having carbon numbers 4 to 18. In detail, the organic materials 20 may be fatty acids, for example, an oleic acid having a composition of $C_{18}H_{34}O_2$. In this case, since a length of one organic material 20 may be several nanometers or less, a thickness D2 of a coating layer by the organic material 20 may also be within a range of several nanometers to tens of nanometers. For example, the thickness D2 may be 5 nm or less.

Figure 4:
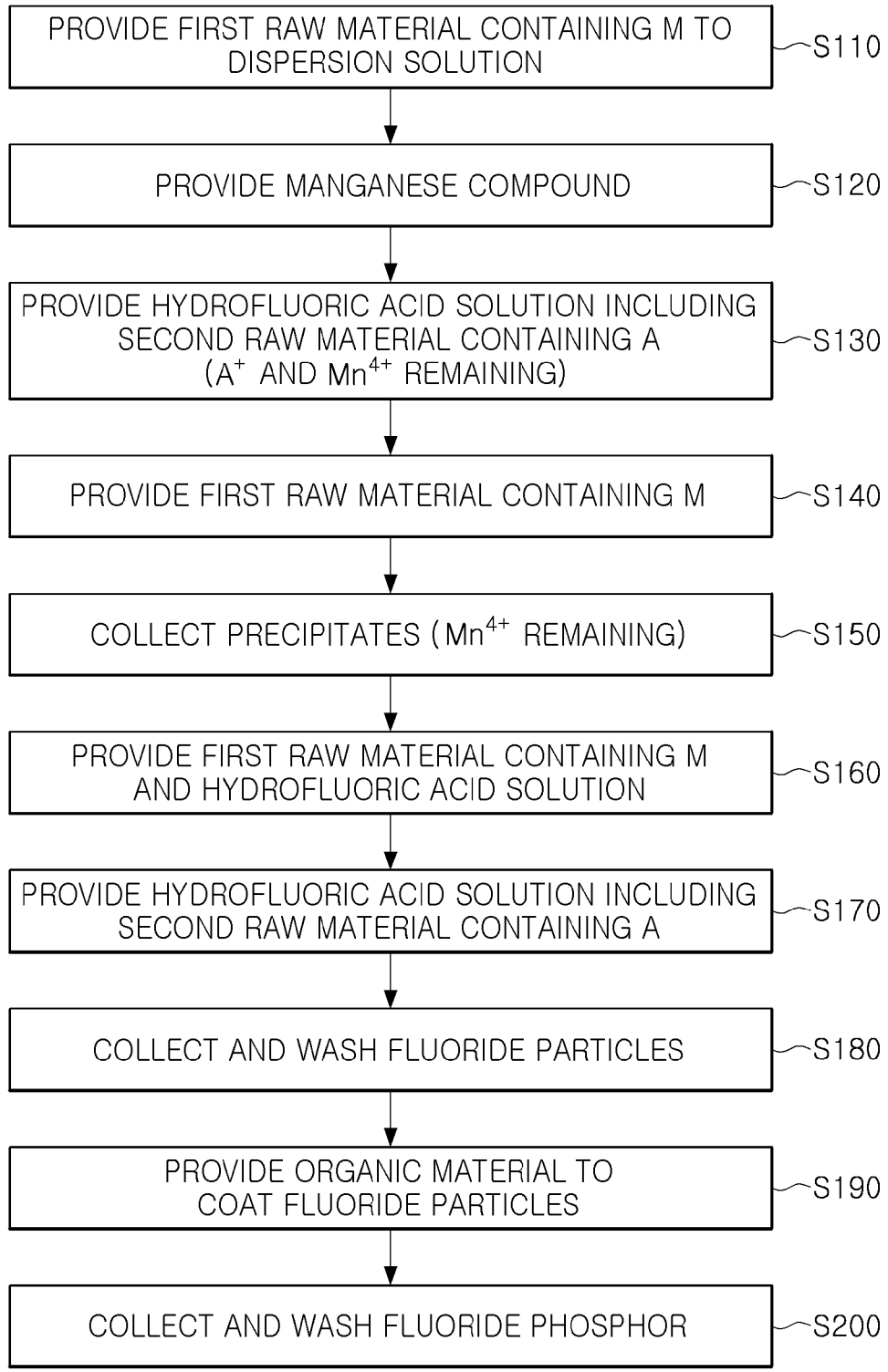
FIG. 4 is a flowchart illustrating a method of manufacturing a fluoride phosphor according to an exemplary embodiment.

FIG. 4 is a flowchart illustrating a method of manufacturing a fluoride phosphor according to an exemplary embodiment of the present inventive concept.

With reference to FIG. 4, the operations in operations S110 to S180 with reference to FIG. 2 will be performed in similar manners in manufacturing fluoride particles.

Next, an organic solvent and an organic material may be provided to the washed fluoride particles to coat the fluoride particles with the organic material in operation S190.

As the organic solvent, a solvent allowing for a sufficient dispersion of the organic material may be used. For example, the organic solvent may be acetone. The organic material may be a material physically adsorbable onto surfaces of the fluoride particles. The organic material may have at least one functional group between a carboxylic group (—COOH) and an amino group (—NH$_2$), and may include an organic compound with carbon numbers 4 to 18. For example, the organic material may be oleic acid.

An amount of the organic material may be selected from a range lower than 1:2 in a molar ratio of fluoride particles and an organic material, for example, a range of 1:1 to 1:1.5, which will be described in further detail with reference to Table 1 below. In a case in which the amount of the organic material is beyond the range, flowability of phosphor particles may be reduced, and high-temperature driving performance of a light emitting diode (LED) using the phosphor particles may be degraded.

Subsequently, the fluoride phosphor particles that are fluoride particles coated with the organic material may be washed in operation S200.

In the washing process, residuals generated due to the organic material used in an excessive amount may be removed using an acetone solvent.

Then, the washed fluoride phosphor particles may be dried to obtain a fluoride phosphor according to an exemplary embodiment. After the fluoride phosphor particles are dried, a heat treatment process about 100° C. to about 150° C. may further be performed, selectively.

The coating of the organic material may be performed as a portion of a synthesized process of the fluoride phosphor. The coating may only be performed for a mixing time of several minutes without using a separate additional device, thereby improving process efficiency.

Fluoride Phosphor Characteristics

Table 1 illustrates a content of Mn$^{4+}$ on a surface of a fluoride phosphor, internal quantum efficiency (IQE), an average particle size D50 indicating a median, and an absorption rate. The Mn$^{4+}$ concentration was analyzed through an energy dispersive x-ray spectroscopy (EDS) using a scanning electron microscopy (SEM).

A comparative example provides a fluoride phosphor in which a Mn$^{4+}$ concentration is not changed. An exemplary embodiment provides the fluoride phosphor 10 with reference to FIGS. 1 and 2 and the fluoride particle 10a of the fluoride phosphor 50 with reference to FIGS. 3 and 4.

In the comparative example, the fluoride phosphor was manufactured by adding 2.97 g of K$_2$MnF$_6$ to 360 mL of a hydrofluoric acid, providing 30 m mol of 34% H$_2$SiF$_6$ thereto, and providing 180 mL of hydrofluoric acid in which KHF$_2$ is in a saturation state. In the exemplary embodiment, the fluoride phosphor was manufactured in a method with reference to FIG. 2. In detail, 63 mL of 34% H$_2$SiF$_6$ and 720 mL of hydrofluoric acid were mixed in operation S110, 2.97 g of K$_2$MnF$_6$ was added in operation S120, and then, 15 mL of the second solution in which 75.9 g of KHF$_2$ dissolved in 142 mL of 48% hydrofluoric acid was first added and 55 mL of the second solution was added three more times at 5 minute intervals in operation S130. Next, 12 mL of 34% H$_2$SiF$_6$ was added in operation S140, 360 mL of hydrofluoric acid and 12 mL of 34% H$_2$SiF$_6$ were provided in operation S160, and 30 mL of the second solution in which 37.95 g of KHF$_2$ dissolved in 71 mL of 48% hydrofluoric acid was provided at 5 minute intervals in operation S170.

TABLE 1

| | Mn$^{4+}$ Concentration on Surface | IQE | D50 | Absorption Rate |
|---|---|---|---|---|
| Comparative Example | 2.0 at. % | 0.823 | 15.4 μm | 0.70 |
| Exemplary embodiment | 1.0 at. % | 0.901 | 15.1 μm | 0.68 |

With reference to Table 1, in the case of the exemplary embodiment, the Mn$^{4+}$ concentration on a fluoride phosphor surface is about 1.0 at. % that is about half of that in the comparative example. The exemplary embodiment resulted in relatively high IQE, for example, 0.9 or more of IQE. The D50 and the absorption rates were similar in the comparative example and the exemplary embodiment. As such, in the case of the exemplary embodiment, since the Mn$^{4+}$ concentration on the phosphor surface is relatively low, moisture resistance characteristics may be improved and the IQE may be improved.

Figure 5:
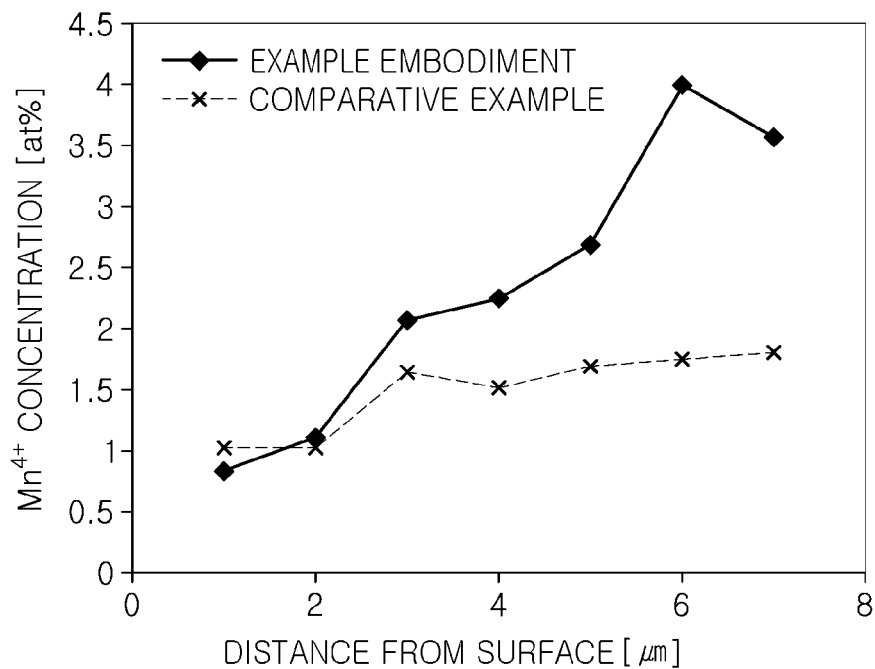
FIG. 5 is a graph illustrating a $Mn^{4+}$ concentration of a fluoride phosphor according to an exemplary embodiment.

FIG. 5 is a graph illustrating a Mn$^{4+}$ concentration of a fluoride phosphor according to an exemplary embodiment.

FIG. 5 illustrates a change in Mn$^{4+}$ concentration depending on a distance from a surface of phosphor to a center thereof in the phosphors of the comparative example and the exemplary embodiment. The Mn$^{4+}$ concentration was analyzed through EDS after cross-sectional cutting the phosphor particle using a focused ion beam (FIB) device.

As illustrated in FIG. 5, in the case of the comparative example, the Mn$^{4+}$ concentration is little changed within a range of about 1 at. % to about 2 at. % thereof. On the other hand, in the case of the exemplary embodiment, the phosphor may have a center at a point of 6 μm or between 6 μm and 7 μm in a distance from a surface. Here, Mn$^{4+}$ had a high concentration of about 4 at. % in a central region of the phosphor or a region near the center, and had about 1 at. % of concentration in a region near a surface. In the case of the exemplary embodiment, the Mn$^{4+}$ concentration was continuously reduced toward the surface of the phosphor from the center, and a region in which the Mn$^{4+}$ concentration is uniform or constant was not formed in fpm or more.

Table 2 illustrates IQE and D50 of fluoride phosphors manufactured in different conditions according to exemplary embodiments.

Embodiment 1 provides a fluoride phosphor as described above with reference to FIGS. 1 and 2, for example, a fluoride phosphor having a composition of $K_2SiF_6:Mn^{4+}$ not coated with an organic material.

Embodiments 2 to 4 provide fluoride phosphors which are respectively coated with an organic material at different mole ratios of a fluoride particle and an organic material. In exemplary Embodiments 2 to 4, 30 g of $K_2S_iF_6:_Mn^{4+}$ fluoride particles were coated with oleic acid. The coating was performed by respectively providing 43 mL, 64 mL and 85 mL of oleic acid to 500 mL of acetone solvent. Thus, the organic material was provided in such a manner that molar ratios of the fluoride particle and the organic material were 1:1, 1:1.5 and 1:2, respectively. In exemplary embodiments 2 to 4, C—H coupling was confirmed through Fourier transform infrared spectroscopy (FT-IR) analysis. Here, it was confirmed that a relatively strong coating was formed by signal intensity increased according to an increase in a use amount of oleic acid.

TABLE 2

|  | Exemplary Embodiment 1 | Exemplary Embodiment 2 | Exemplary Embodiment 3 | Exemplary Embodiment 4 |
| --- | --- | --- | --- | --- |
| IQE | 0.901 | 0.907 | 0.905 | 0.911 |
| D50 | 15.10 μm | 15.05 μm | 15.20 μm | 15.12 μm |

With reference to FIG. 2, IQEs have high values of 0.9 or more and D50s are about 15 μm in the exemplary embodiments. It can be appreciated that a significant difference between the exemplary embodiments with respect to IQE and D50 is not present. It means that since the organic material has a relatively short length of several nanometers so as to be thinly coated, light characteristics or particle size characteristics of the phosphor are not changed.

Figure 10:
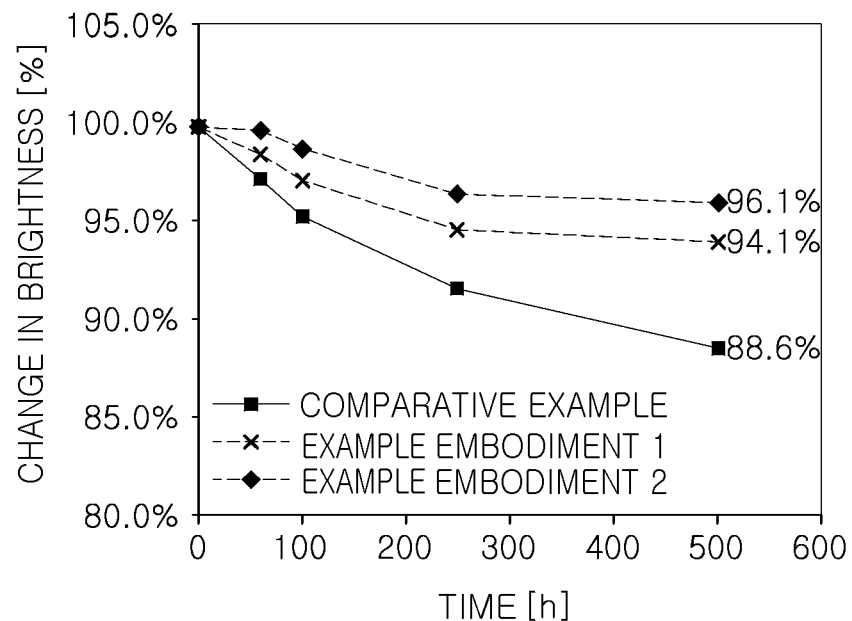
FIGS. 10 and 11 are graphs illustrating reliability of white light emitting devices to which a fluoride phosphor according to an exemplary embodiment.
Figure 11:
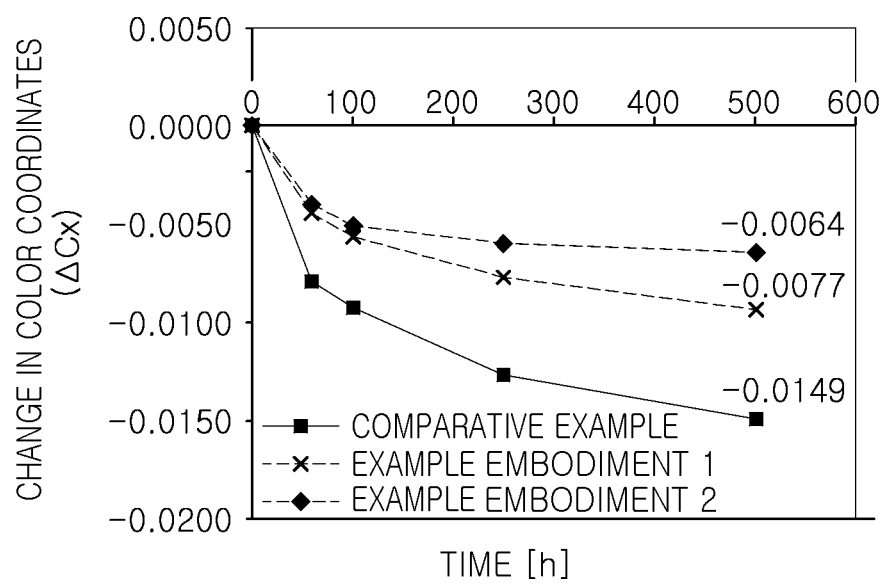

However, although not separately illustrated, as a result of performing a driving test on an LED package at a high temperature in a manner similar to FIGS. 10 and 11, when an amount of organic material was relatively great, high temperature driving characteristics were degraded. It can be estimated therefrom that the degradation of high temperature driving characteristics was caused due to the organic material used in the exemplary embodiments, for example, the oleic acid having relatively low resistance to heat. Thus, the amount of organic material used for absorption and coating may be selected from a range lower than 1:2 in a molar ratio of fluoride particles and an organic material, for example, a range of 1:1 to 1:1.5 in a molar ratio of fluoride particles and an organic material.

Figure 6:
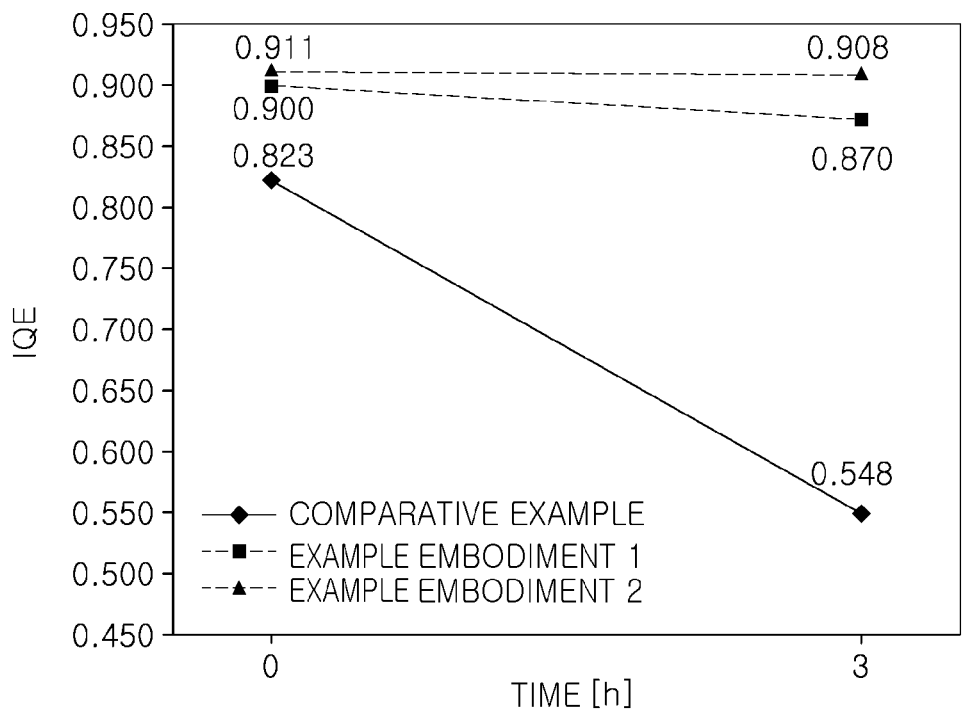
FIG. 6 is a graph illustrating reliability of a fluoride phosphor according to an exemplary embodiment.

FIG. 6 is a graph illustrating reliability of a fluoride phosphor according to an exemplary embodiment.

With reference to FIG. 6, a result of a preservation test of a fluoride phosphor manufactured under high-temperature and high-humidity conditions is provided. The fluoride phosphor was preserved in a powder state at 85° C. and at a level of humidity of 85% for 3 hours.

As described above, the comparative example provides the fluoride phosphor in which a $Mn^{4+}$ concentration is not changed in the inside thereof. Exemplary embodiment 1 provides the fluoride phosphor as described above with reference to FIGS. 1 and 2, having a composition of $K_2SiF_6$: $Mn^{4+}$ not coated with an organic material. Exemplary embodiment 2 provides the fluoride phosphor as described above with reference to FIGS. 3 and 4, coated with an organic material, an oleic acid.

As a result of performing a preservation test on the comparative Example and the exemplary embodiments 1 and 2, IQE was rapidly reduced depending on lapse of time in the comparative example, finally reduced to about 70% of initial IQE. However, in the case of the fluoride phosphors according to exemplary embodiments 1 and 2, the reduction in IQE was relatively low. In exemplary embodiment 1, the IQE was reduced by about 3%. In the case of exemplary embodiment 2 in which the organic material was coated, the IQE was only slightly reduced, and even after 3 hours, was only reduced by about 0.3%.

This may be resulted from a relatively low content of $Mn^{4+}$ on a surface of the fluoride phosphor according to the exemplary embodiments, as compared with that of the comparative example. $K_2SiF_6:Mn^{4+}$ may react with moisture as illustrated in the following reaction formula 1.

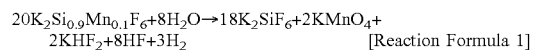

$20K_2Si_{0.9}Mn_{0.1}F_6 + 8H_2O \rightarrow 18K_2SiF_6 + 2KMnO_4 + 2KHF_2 + 8HF + 3H_2$  [Reaction Formula 1]

As illustrated in reaction formula 1, Mn of the fluoride phosphor reacts with moisture to form an oxide, $KMnO_4$, and phosphor characteristics may be degraded. Thus, when the content of $Mn^{4+}$ is relatively low on a surface of the fluoride phosphor according to the exemplary embodiments, the characteristic of a fluoride phosphor having relatively low moisture resistance may be improved. When an organic material is coated as illustrated in Exemplary Embodiment 2, since the surface of the fluoride phosphor has hydrophobicity, low resistance characteristics with respect to moisture may be further improved.

Lighting Emitting Device including Fluoride Phosphor

Figure 7:
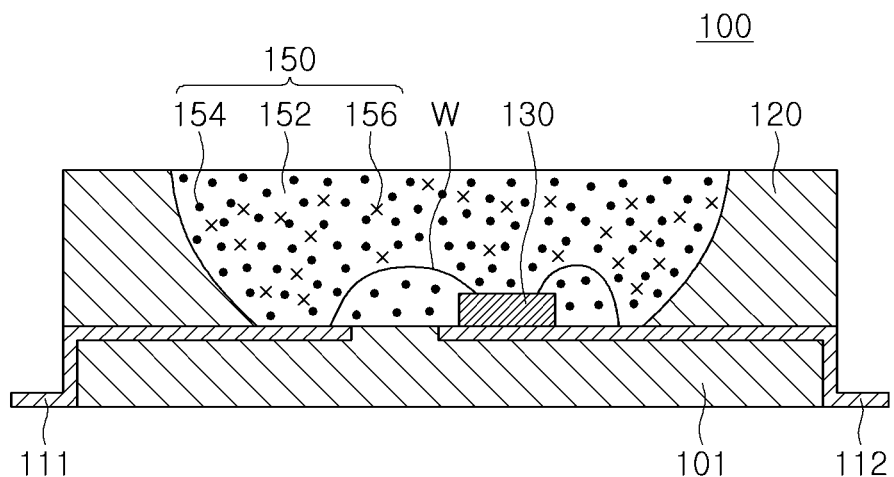
FIG. 7 is a schematic cross-sectional view of a light emitting device according to an exemplary embodiment.

FIG. 7 is a schematic cross-sectional view of a light emitting device according to an exemplary embodiment of the present inventive concept.

With reference to FIG. 7, a lighting device 100 may include a substrate 101, a light emitting element 130 disposed on the substrate 101, and a wavelength conversion unit 150. The light emitting device 100 may include a pair of lead frames 111 and 112 electrically connected to the light emitting element 130, a body portion 120 having a cup shape, and a conductive wire W connecting the light emitting element 130 to the lead frames 111 and 112. Thus, the light emitting device 100 may configure a light emitting device package.

The substrate 101 may be molded using an opaque resin or a resin having relatively high reflectivity, and may also be molded using a polymer resin facilitating an injection molding process. The substrate 101 may be formed of ceramic, and in this case, heat emissions may be facilitated. According to an exemplary embodiment, the substrate 101 may be a printed circuit board having a wiring pattern formed thereon.

The pair of lead frames 111 and 112 may be disposed on the substrate 101, and may be electrically connected to the light emitting element 130 to apply driving power to the light emitting element 130. The lead frames 111 and 112 may be electrically connected to the light emitting element 130 through the conductive wire W, and may be used as terminals for receiving an external electrical signal. To this end, the lead frames 111 and 112 may be formed of a metal having excellent conductivity. According to an exemplary embodiment, the light emitting element 130 may directly contact the lead frames 111 and 112 to be connected thereto, rather than by the conductive wire W.

The body portion 120 may be disposed on the substrate 101 and the lead frames 111 and 112, and may form a cavity receiving the light emitting element 130 therein. The body portion 120 may have a cup shape to improve reflective efficiency of light, but is not limited thereto. According to an exemplary embodiment, the body portion 120 may also be integrated with the substrate 101 to configure a package body.

The light emitting element 130 may be disposed on the surface 101, and may be an electroluminescent element emitting light when an electrical signal is applied thereto. The light emitting device 100 may emit blue light. For example, the light emitting element 130 may be a semiconductor light emitting element including a semiconductor layer grown epitaxially. The light emitting element 130 may be a nanoscale light emitting element including a plurality of light emitting nanostructures.

The wavelength conversion unit 150 may be disposed in a cavity formed by the body portion 120, and may include an encapsulation layer 152, a fluoride phosphor 154 dispersed in the encapsulation layer 152, and a green phosphor 156. The fluoride phosphor 154 may be the fluoride phosphor according to the exemplary embodiment described above. The wavelength conversion unit 150 may emit visible light that is excited by excitation light emitted by the light emitting element 130 to have a converted wavelength. For example, the fluoride phosphor 154 and the green phosphor 156 may be excited by blue light emitted by the light emitting element 130 to respectively emit red light and green light. The encapsulation layer 152 may be formed of a light transmitting resin, and for example, may include epoxy, silicon, modified silicon, a urethane resin, an oxetane resin, acryl, polycarbonate, polyimide, or a combination thereof.

In the exemplary embodiment, since the fluoride phosphor 154 has a relatively low surface concentration of $Mn^{4+}$, relatively high moisture resistance may be exhibited. Device reliability may be secured even in the case that a member protecting a wavelength conversion unit, such as separate cover glass, is not present, and a process may be simplified.

Figure 8:
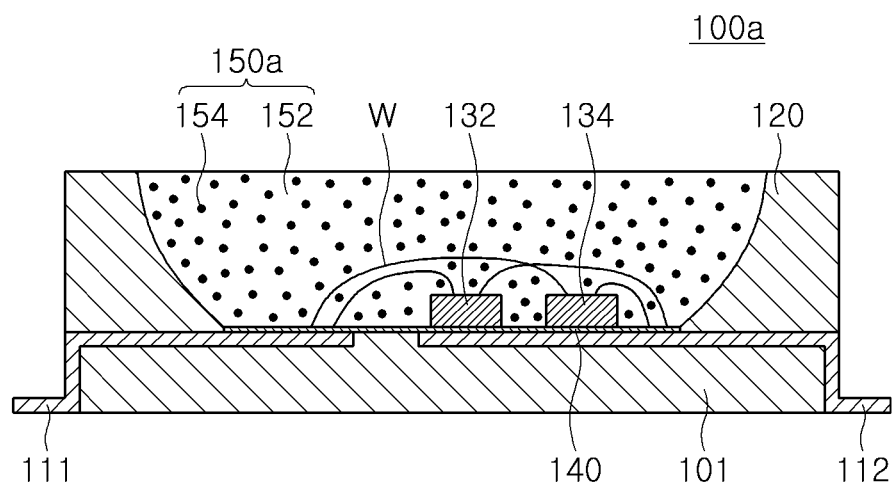
FIG. 8 is a schematic cross-sectional view of a light emitting device according to an exemplary embodiment.

FIG. 8 is a schematic cross-sectional view of a light emitting device according to an exemplary embodiment.

With reference to FIG. 8, a light emitting device 100a may include a substrate 101, first and second light emitting elements 132 and 134 disposed on the substrate 101, a protective layer 140, and a wavelength conversion unit 150a. The light emitting device 100a may include a pair of lead frames 111 and 112 electrically connected to the first and second light emitting elements 132 and 134, a body portion 120 having a cup shape, and a conductive wire W connecting the first and second light emitting elements 132 and 134 to the lead frames 111 and 112.

In the light emitting device 100a according to the exemplary embodiment, two light emitting elements, for example, the first and second light emitting elements 132 and 134, may be mounted on the substrate 101 in a manner different from the exemplary embodiment of FIG. 7. The first and second light emitting elements 132 and 134 may emit light of different wavelengths. For example, the first light emitting element 132 may emit green light, and the second light emitting element 134 may emit blue light. Thus, the wavelength conversion unit 150a may only include an encapsulation layer 152 and a fluoride phosphor 154 according to an exemplary embodiment.

The protective layer 140 may be disposed on at least one surface of the wavelength conversion unit 150a. In the exemplary embodiment, although the protective layer 140 is disposed on a lower surface of the wavelength conversion unit 150a, for example, between the wavelength conversion unit 150a and the substrate 101, the disposition of the protective layer 140 may be variously changed according to exemplary embodiments. For example, the protective layer 140 may be disposed on both of an upper surface and a lower surface of the wavelength conversion unit 150a, or may be disposed to encompass the entirety of the wavelength conversion unit 150a.

The protective unit 140 may protect the fluoride phosphor 154 from an external environment, for example, moisture, and may secure reliability of the light emitting device 100a. The protective layer 140 may be formed of a moisture resistive material capable of preventing the permeation of moisture. A thickness of the protective layer 140 is not limited to the illustration of the drawing. In the light emitting device 100a according to the exemplary embodiment, the fluoride phosphor 154 may have a relatively low content of manganese, thereby reducing low moisture resistance. As the protective layer 140 is employed, the reliability of the light emitting device may be further increased. However, the protective layer 140 may be omitted according to an exemplary embodiment of the present inventive concept.

The protective layer 140 may be formed of a resin material such as epoxy, silicon, modified silicon, a urethane resin, an oxetane resin, acryl, polycarbonate, polyimide, and the like. In this case, reflectivity of the protective layer 140 may be different from that of the encapsulation layer 152 to improve light extraction efficiency. Alternatively, the protective layer 140 may be a coating layer formed of a fluoride-based or silica-based coating agent.

Figure 9:
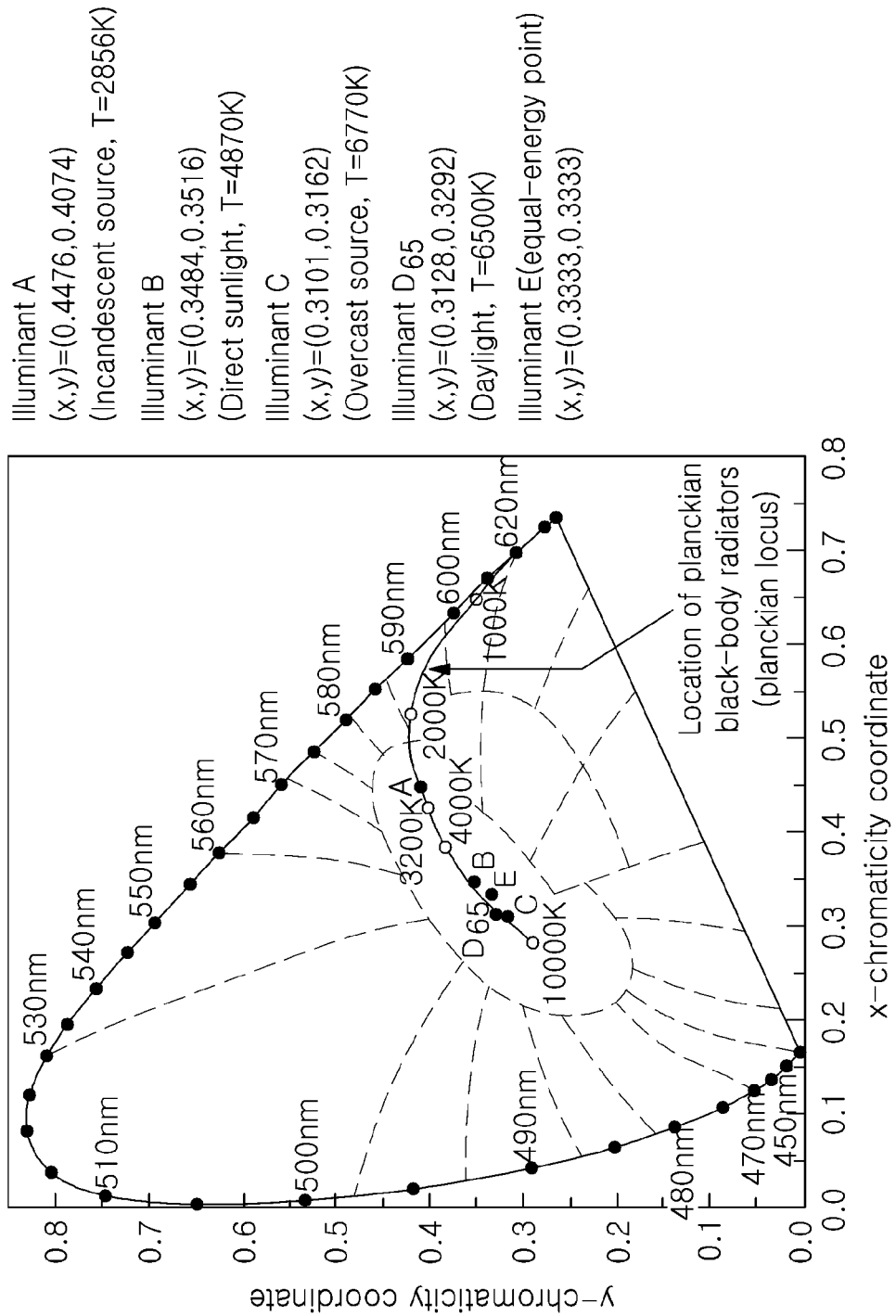
FIG. 9 is a CIE 1931 color space diagram for illustrating a wavelength conversion material employable in an exemplary embodiment.

FIG. 9 is a CIE 1931 color space diagram for illustrating a wavelength conversion material employable in a light emitting device according to an exemplary embodiment.

For example, when the light emitting element 130 or 134 of FIGS. 7 and 8 emits blue light, the light emitting device 100 or 100a including at least one of yellow, green, red phosphors may emit white light of various color temperatures by adjusting a phosphor mixing ratio. For example, a color temperature and color rendering index (CRI) of white light may be controlled by additionally combining a green and/or a red phosphor with a yellow phosphor.

White light obtained by combining yellow, green, red phosphors and/or green and red light emitting elements with a blue light emitting element may have two or more peak wavelengths, and coordinates (x, y) of the CIE 1931 chromaticity coordinates system may be located on line segments (0.4476, 0.4074), (0.3484, 0.3516), (0.3101, 0.3162), (0.3128, 0.3292), and (0.3333, 0.3333) connected to one another as illustrated in FIG. 9. Alternatively, the coordinates (x, y) may be located in a region surrounded by the line segments and black body radiation spectrum. A color temperature of the white light may be within a range of 1500K to 20000K.

In FIG. 9, white light in the vicinity of a point E (0.3333, 0.3333) below the black body radiation spectrum may be in a state in which light of a yellow-based component becomes relatively weak. This white light may be used as an illumination light source of a region in which a relatively bright or refreshing mood may be provided to the naked eye. Thus, a lighting device product using white light in the vicinity of the point E (0.3333, 0.3333) below the black body radiation spectrum may be effective for use in retail spaces in which groceries, clothing, or the like are for sale.

As a phosphor used for the light emitting device described above, a phosphor as described below may be used. In the case of a red phosphor, a fluoride phosphor according to exemplary embodiments may be used. For example, the fluoride phosphor 154 may include a fluoride phosphor represented by $A_xMF_y:Mn^{4+}$, and for example, may be $K_2SiF_6:Mn^{4+}$, $K_2TiF_6:Mn^{4+}$, $NaYF_4:Mn^{4+}$, or $NaGdF_4:Mn^{4+}$. The wavelength conversion unit 150 or 150a may further include other phosphors illustrated below by way of example.

Oxide-based Phosphors: Yellow and green $Y_3Al_6O_{12}:Ce$, $Tb_3Al_5O_{12}:Ce$, $Lu_3Al_5O_{12}:Ce$ Silicate-based Phosphors: Yellow and green $(Ba,Sr)_2SiO_4:Eu$, Yellow and yellowish-orange $(Ba,Sr)_3SiO_5:Ce$ Nitride-based Phosphors: Green β-SiAlON:Eu, Yellow $La_3Si_6N_{11}:Ce$, Orange α-SiAlON:Eu Characteristics of Light Emitting Device Including Fluoride Phosphor FIGS. 10 and 11 are graphs illustrating reliability of a white light emitting device to which a fluoride phosphor according to an exemplary embodiment.

A white light emitting device used in the evaluation includes a light emitting element emitting blue light having about 446 nm to about 450 nm of peak wavelength, a β-sialon phosphor emitting green light having a peak wavelength of about 540 nm, and a fluoride phosphor emitting red light. The comparative example and exemplary embodiments 1 and 2 correspond to the white light emitting devices including a fluoride phosphor of the comparative example and exemplary embodiments 1 and 2 described with reference to FIG. 6, respectively.

With reference to FIGS. 10 and 11, operational characteristics of a white light emitting device including a change in brightness and a movement degree ACx of color coordinates depending on lapse of time are illustrated. Evaluation of reliability was carried out at 85° C. and 85% of humidity in 6 V and 150 mA of operational conditions.

As illustrated in FIG. 10, the change in brightness was lowered to 88.6% after 500 hours had elapsed, based on an initial 100%, in the comparative example. In the case of exemplary embodiment 1, the change in brightness was lowered to 94.1%, for example, lowered by about 5.9%, with relatively high reliability. In the case of exemplary embodiment 2, the change in brightness was lowered to 96.1%, for example, lowered about 3.9%, with excellent characteristics.

As illustrated in FIG. 11, a change in color coordinates ACx after a lapse of 500 hours was −0.0149 in the comparative example. In exemplary embodiments 1 and 2, change ranges thereof were relatively low, −0.0077 and −0.0064, respectively. Exemplary embodiment 2 in which an organic material is coated exhibited the most excellent characteristics.

Figure 12:
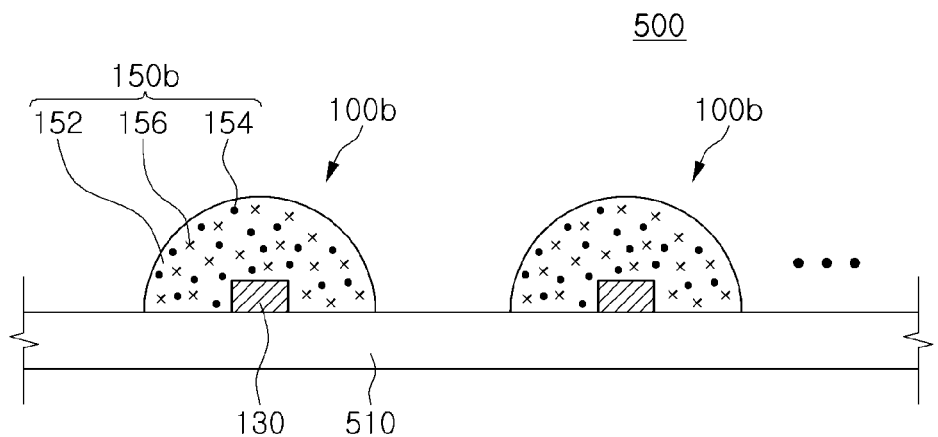
FIGS. 12 and 13 are schematic cross-sectional views of white light source modules according to various aspects of exemplary embodiments.
Figure 13:
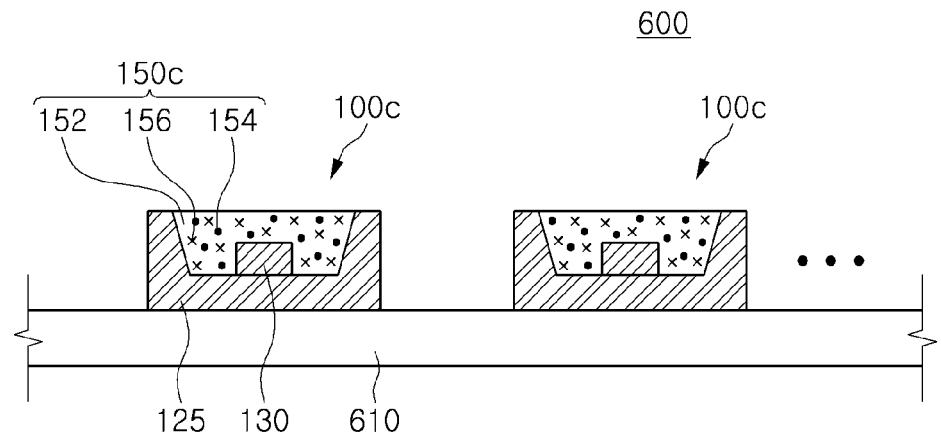

Light Source Module, Backlight Unit, Display Device, and Lighting Device Including Fluoride Phosphor FIGS. 12 and 13 are schematic cross-sectional views of white light source modules according to exemplary embodiments.

With reference to FIG. 12, a light source module 500 for liquid crystal display (LCD) backlight may include a circuit board 510, and a plurality of white light emitting devices 100b arranged on the circuit board 510. A conductive pattern connected to the white light emitting devices 100b may be formed on the circuit board 510.

Each white light emitting device 100b may have a structure in which a light emitting element 130 emitting blue light is directly mounted on the circuit board 510 in a chip on board (COB) scheme unlike the case of the light emitting device described above with reference to FIG. 7. The respective white light emitting devices 100b may not have a separate reflective wall, and the wavelength conversion unit 150b may have a semispherical shape having a lens function to exhibit a wide-beam angle. Such a wide-beam angle may contribute to a reduction in a thickness or a width of an LCD display.

With reference to FIG. 13, a light source module 600 for an LCD backlight may include a circuit board 610 and a plurality of white light emitting devices 100c arranged on the circuit board 610. Each white light emitting device 100c may include a light emitting element 130 emitting blue light and mounted in the reflective cup of a package body 125, and a wavelength conversion unit 150c encapsulating the light emitting element 130. The wavelength conversion unit 150c may include a fluoride phosphor 154 emitting red light and a green phosphor 156 distributed therein, and may further include a yellow or yellowish-orange phosphor.

FIGS. 14 to 18 are schematic cross-sectional views of backlight units according to exemplary embodiments.

Figure 14:
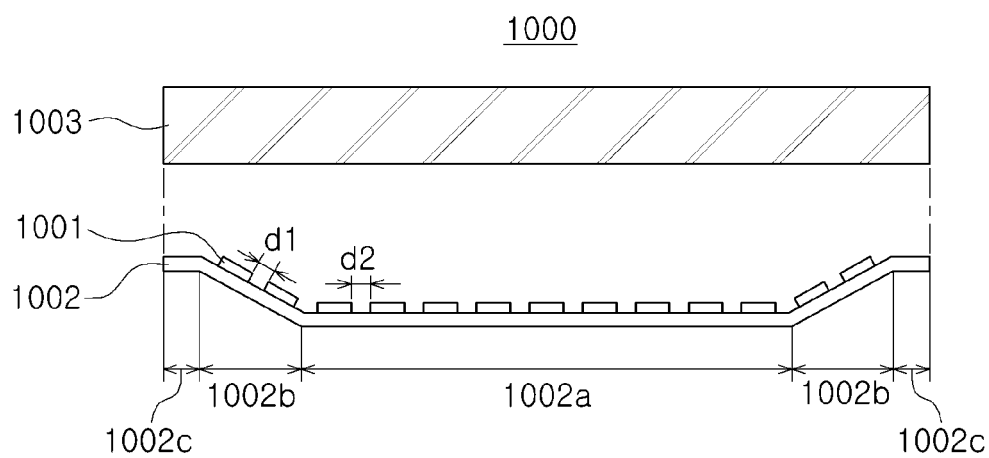
FIGS. 14 to 18 are schematic cross-sectional views of backlight units according to various aspects of exemplary embodiments.

With reference to FIG. 14, a backlight unit 1000 may include a circuit board 1002, light sources 1001 mounted on the circuit board 1002, and one or more optical sheets 1003 disposed above the light sources 1001.

The light sources 1001 may be white light emitting devices containing a coated fluoride phosphor according to an exemplary embodiment, and a module in which the light sources 1001 are mounted on the circuit board 1002 may be a light source module with reference to FIG. 12 or 13.

The circuit board 1002 employed in the exemplary embodiment may include a first flat portion 1002a corresponding to a main region thereof, and an inclined portion 1002b adjacent thereto, formed in a manner in which at least a portion thereof is bent, and a second flat portion 1002c provided as an outer side of the inclined portion 1002b and disposed in an edge portion of the circuit board 1002.

On the first flat portion 1002a, the light sources may be arranged to have a second interval d2 therebetween, and on the inclined portion 1002b, one or more light sources 1001 may be arranged to have a first interval d1 therebetween. The first interval d1 may be equal to the second interval d2. A width, in detail, a length thereof in a cross section, of the inclined portion 1002b, may be less than a width of the first flat portion 1002a and may be greater than that of the second flat portion 1002c. In addition, at least one light source may also be disposed on the second flat portion 102c as needed. An inclination of the inclined portion 1002b may be appropriately adjusted in a range greater than 0 degree and less than 90 degrees, based on the first flat portion 1002a.

As the circuit board 1002 has such a structure, brightness may also be uniformly maintained in the vicinity of an edge of the optical sheet 1003.

Figure 15:
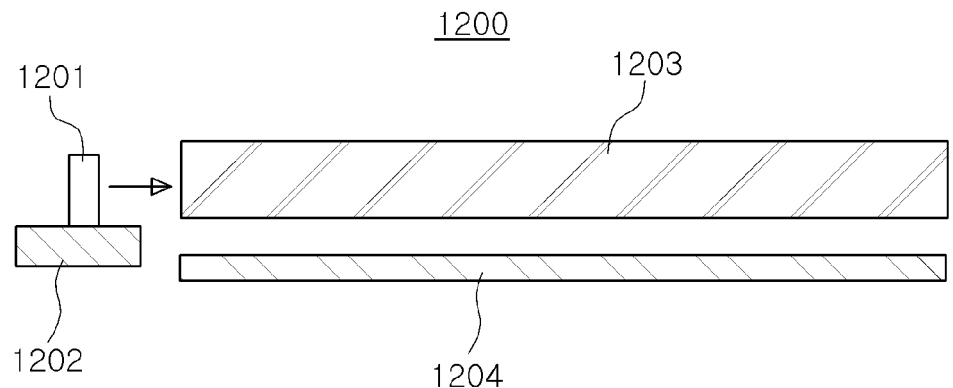

With reference to FIG. 15, in the case of a backlight unit 1200 according to an exemplary embodiment, a light source 1201 mounted on a substrate 1202 emits light in a lateral direction such that the emitted light may be incident onto a light guiding panel 1203 to be converted into a form of surface light source type light. Light passing through the light guiding panel 1203 may be discharged in an upward direction, and a reflective layer 1204 may be disposed below the light guiding panel 1203 to improve light extraction efficiency.

Figure 16:
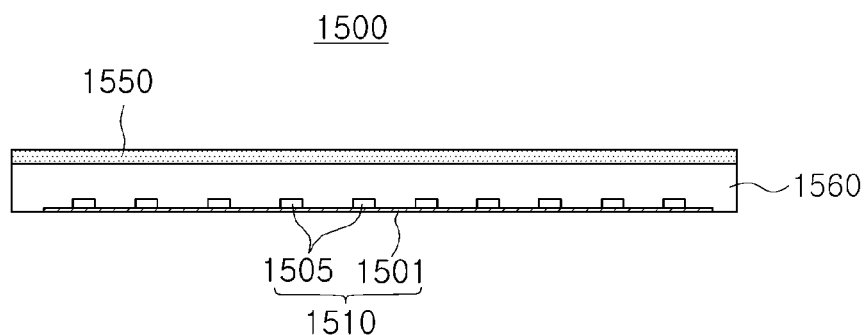
Figure 17:
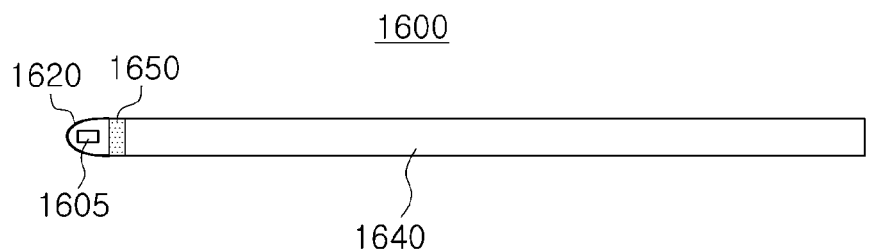
Figure 18:
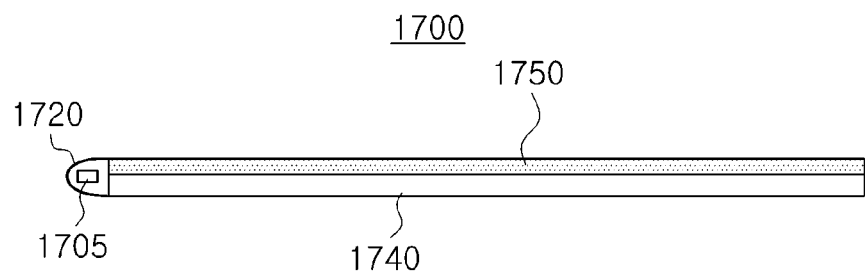

In the case of backlight units 1500, 1600, and 1700 with reference to FIGS. 16 to 18, the wavelength conversion unit 150 (see FIG. 7) may not be disposed in a light emitting device 1505, 1605, or 1705. For example, the wavelength conversion unit 150 may be disposed outside the light emitting device 1505, 1605, or 1705 so as to be located within the backlight unit 1500, 1600 or 1700 to convert light.

With reference to FIG. 16, the backlight unit 1500 may be a direct-type backlight unit and may include a wavelength conversion unit 1550, light source modules 1510 arranged below the wavelength conversion unit 1550, and a bottom case 1560 receiving the light source module 1510. In addition, the light source module 1510 may include a printed circuit board 1501, and a plurality of light emitting devices 1505 mounted on the printed circuit board 1501. Examples of the light emitting device 1505 may include a light emitting device having a form in which the wavelength conversion unit 150 or 150*a* is omitted from one of the light emitting devices 100 and 100*a* of FIGS. 7 and 8.

In the backlight unit 1500 according to the exemplary embodiment, a wavelength conversion unit 1550 may be disposed on the bottom case 1560. The wavelength conversion unit 1550 may include a fluoride phosphor in a manner similar to the wavelength conversion unit 150 of FIG. 7. Thus, a wavelength of at least a portion of light emitted by the light source module 1510 may be converted by the wavelength conversion unit 1550. The wavelength conversion unit 1550 may be manufactured as a separate film and used, or may be provided in a form integrated with a light diffusion plate not illustrated.

With reference to FIGS. 17 and 18, a backlight unit 1600 or 1700 may be provided as an edge-type backlight unit, and may include a wavelength conversion unit 1650 or 1750, a light guiding plate 1640 or 1740, a reflective unit 1620 or 1720 disposed on a side of the light guiding plate 1640 or 1740, and a light source 1605 or 1705.

Light emitted by the light source 1605 or 1705 may be guided to an inner portion of the light guiding plate 1640 or 1740 by the reflective unit 1620 or 1720. In the backlight unit 1600 of FIG. 17, the wavelength conversion unit 1650 may be disposed between the light guiding plate 1640 and the light source 1605. In the backlight unit 1700 of FIG. 18, the wavelength conversion unit 1750 may be disposed on a light emission surface of the light guiding plate 1740.

The light source 1605 or 1705 may include a light emitting device having a form in which the wavelength conversion unit 150 or 150*a* is omitted from one of the light emitting devices 100 and 100*a* of FIGS. 7 and 8.

Figure 19:
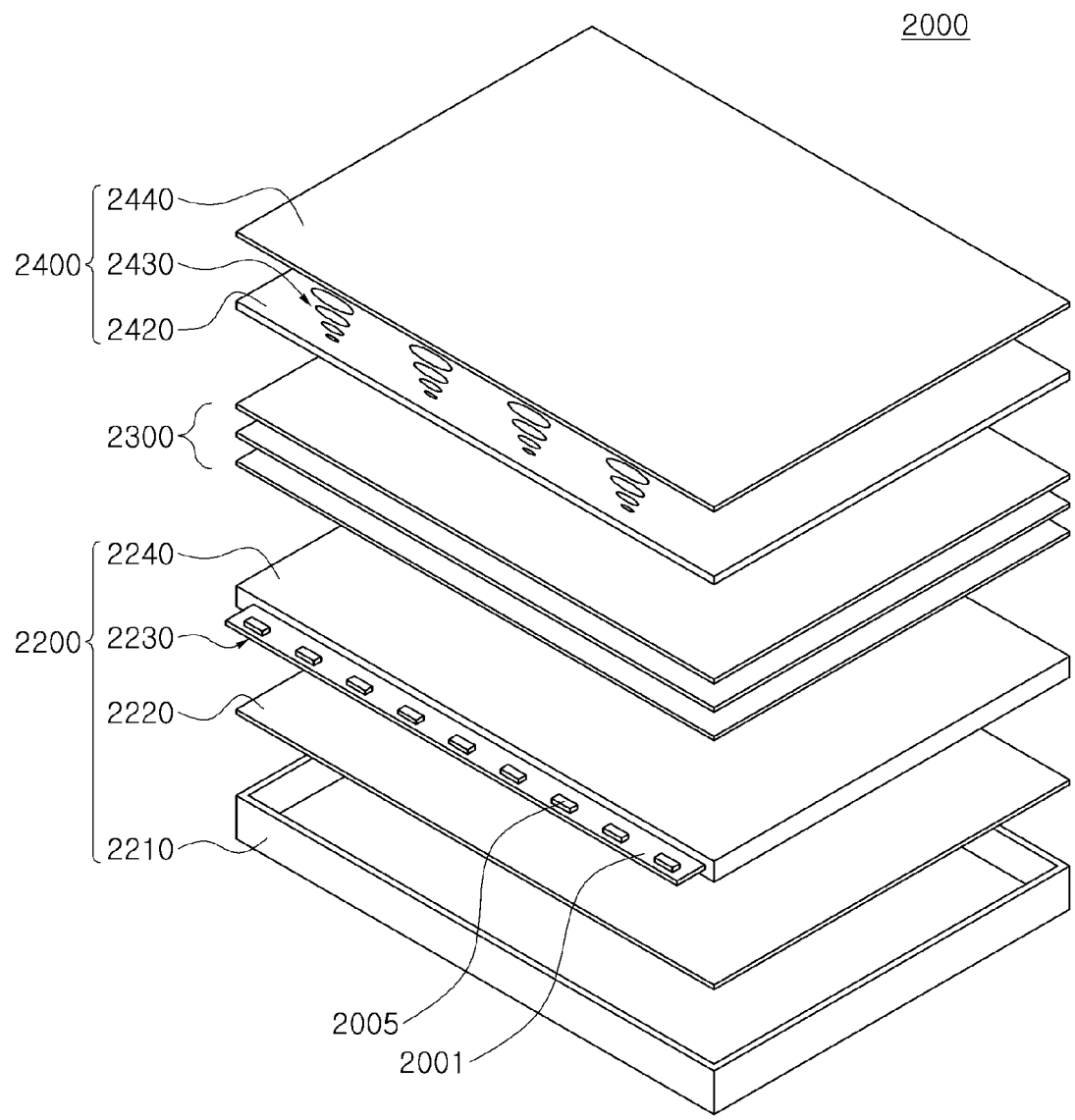
FIG. 19 is a schematic exploded perspective view of a display device according to an exemplary embodiment.

FIG. 19 is a schematic exploded perspective view of a display device according to an exemplary embodiment.

With reference to FIG. 19, a display device 2000 may include a backlight unit 2200, an optical sheet 2300, and an image display panel 2400 such as a liquid crystal panel.

A backlight unit 2200 may include a bottom case 2210, a reflective plate 2220, a light guiding plate 2240, and a light source module 2230 provided on at least one side of the light guiding plate 2240. The light source module 2230 may include a printed circuit board 2001 and light emitting devices 2005. The light emitting device 2005 may include one of the light emitting devices 100 and 100*a* of FIGS. 7 and 8. In detail, the light emitting device 2005 may be a side view type light emitting device with a side surface mounted to be adjacent to the light emission surface. In addition, according to an exemplary embodiment, the backlight unit 2200 may be replaced by any one of the backlight units 1000, 1200, 1500, 1600, and 1700 of FIGS. 14 to 18.

The optical sheets 2300 may be disposed between the light guiding plate 2240 and the image display panel 2400, and may include several types of sheet such as a diffusion sheet, a prism sheet, or a protective sheet.

The image display panel 2400 may display an image using light emitted through the optical sheets. The image display panel 2400 may include an array substrate 2420, a liquid crystal layer 2430, and a color filter substrate 2440. The array substrate 2420 may include pixel electrodes disposed in a matrix form, thin film transistors applying a driving voltage to the pixel electrodes, and signal lines allowing for operation of the thin film transistors. The color filter substrate 2440 may include a transparent substrate, a color filter, and a common electrode. The color filter may include filters allowing a specific wavelength of light to pass therethrough among white light emitted by the backlight unit 2200. The liquid crystal layer 2430 may be re-arranged by an electric field formed between the pixel electrodes and a common electrode to adjust light a transmitting rate. Light of which a light transmitting rate has been adjusted may pass through the color filter to thereby display an image. The image display panel 2400 may further include a driving circuit unit processing an image signal and the like.

With a display device 2000 according to the exemplary embodiment, since a light emitting device 2005 emitting red light, green light and blue light having a relatively narrow full width at half maximum is used, emitted light passes through the color filter substrate 2440 and then may implement blue, green and red color having relatively high color purity.

Figure 20:
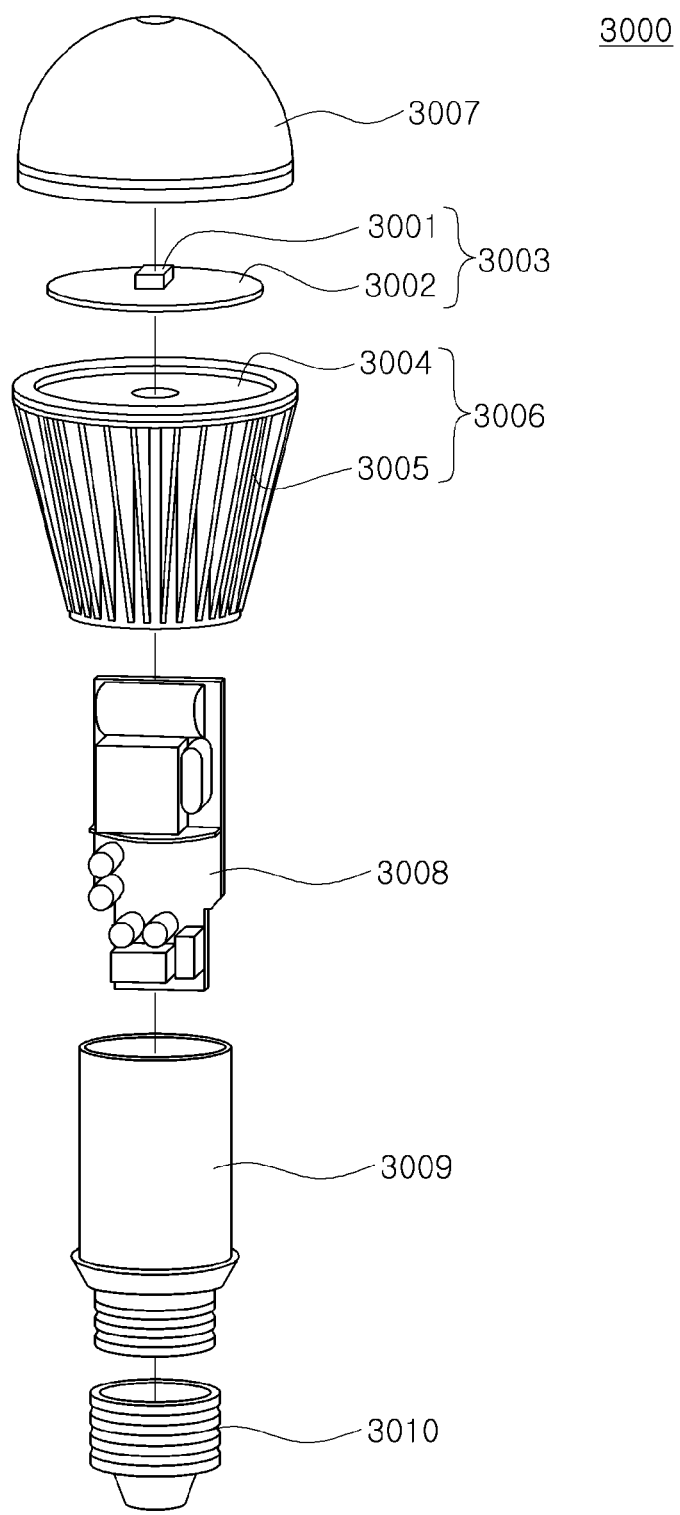
FIG. 20 is a schematic exploded perspective view of a lighting device according to an exemplary embodiment.

FIG. 20 is a schematic exploded perspective view of a lighting device according to an exemplary embodiment.

With reference to FIG. 20, a lighting device 3000 is illustrated as a bulb type lamp by way of example, and may include a light source module 3003, a driving unit 3008, and an external connection unit 3010. The lighting device 3000 may further include an external structure such as an external housing 3006, an internal housing 3009, and a cover unit 3007. The light source module 3003 may include a semiconductor light emitting device 3001 having a structure the same as or similar structure as the light emitting device 100 or 100*a* of FIG. 7 or FIG. 8, and a circuit board 3002 having the semiconductor light emitting device 3001 mounted thereon. Although the exemplary embodiment illustrates the case in which a single semiconductor light emitting device 3001 is mounted on the circuit board 3002, a plurality of semiconductor light emitting devices 3001 may be installed thereon. In addition, the semiconductor light emitting device 3001 may be first manufactured in a package form and then mounted in a manner other than being directly mounted on the circuit board 3002.

The external housing 3006 may serve as a heat emission part, and may include a heat emission plate 3004 directly contacting the light source module 3003 to improve a heat radiant effect, and heat radiating fins 3005 surrounding a side surface of the lighting device 3000. The cover unit 3007 may be mounted on the light source module 3003 and have a convex lens shape. The driving unit 3008 may be installed in the internal housing 3009 to be connected to the external connection unit 3010 having a socket structure so as to receive power from an external power supply unit. In addition, the driving unit 3008 may serve to convert power into a current source appropriate for driving the light source 3001 of the light source module 3003 and provide the converted current. For example, the driving unit 3008 may be configured of an alternating current-direct current (AC-DC) converter, a rectifying circuit component, and the like.

Although not illustrated in the drawing, the lighting device 3000 may further include a communications module.

Figure 21:
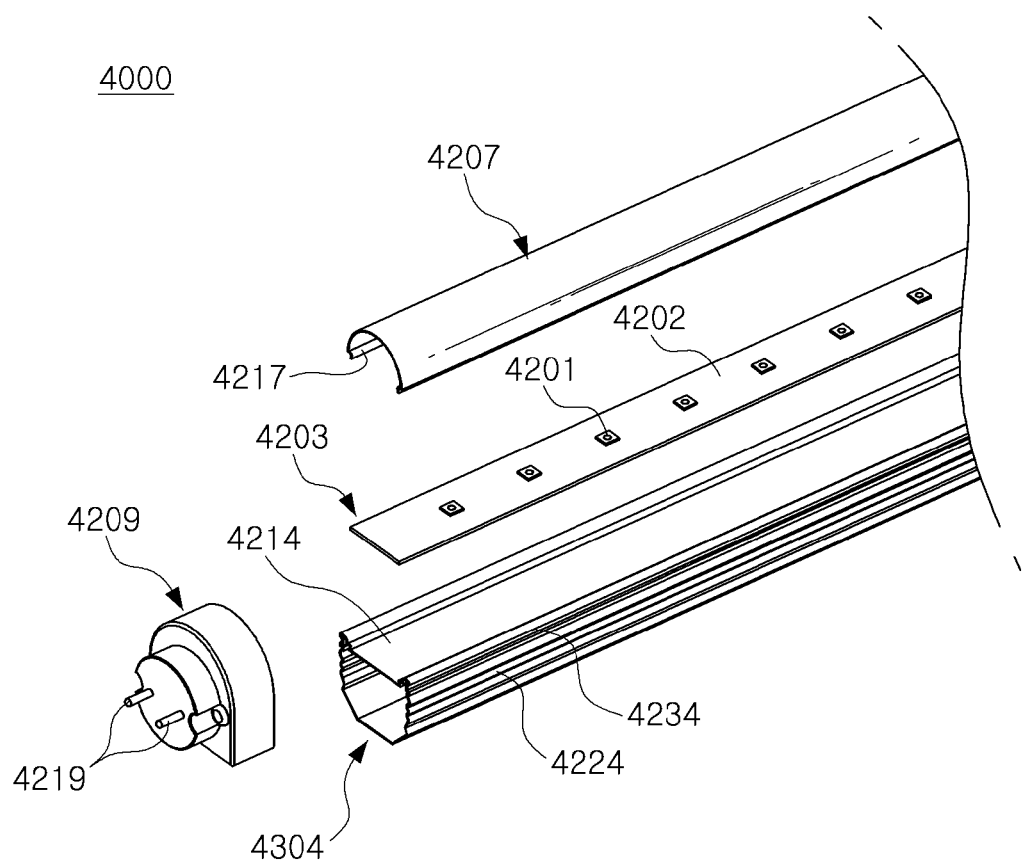
FIG. 21 is a schematic exploded perspective view of a lighting device according to an exemplary embodiment.

FIG. 21 is a schematic exploded perspective view of a lighting device according to an exemplary embodiment.

With reference to FIG. 21, a lighting device 4000 according to an exemplary embodiment may include a light source module 4203, a body portion, and a driving unit 4209, and may further include a cover unit 4207 covering the light source module 4203. The lighting device 4000 may be a bar-type lamp and may have a shape similar to a fluorescent lamp and may emit light having light characteristics similar to that of a fluorescent lamp, but is not limited thereto.

The light source module 4203 may include a mounting substrate 4202 and a plurality of light emitting elements 4201. The plurality of light emitting elements 4201 may have the same structure as or a structure similar to that of the light emitting device 100 or 100a of FIGS. 7 and 8. Alternatively, the light source module 4203 may employ the light source module 500 or 600 for LCD backlight of FIG. 12 or 13.

The light emitting element 4201 may be bonded to a mounting substrate 4202 through a medium of an adhesive member, and the adhesive member may have a scattering pattern.

The body portion 4304 may be provided with the light source module 4203 mounted thereon to be fixed to one surface thereof. The body portion 4304 may serve as a support structure and may include a heat sink. The body portion 4304 may be formed of a material having excellent heat conductivity to be capable of emitting heat generated from the light source module 4203 externally, for example, formed of a metal, but is not limited thereto. The body portion 4304 may have a lengthwise long rod shape corresponding to a shape of the mounting substrate 4202 of the light source module 4203. One surface of the body portion 4304 on which the light source module 4203 is mounted may include a recess portion 4214 in which the light source module 4203 is received. At least one external surface of the body portion 4304 may be provided with a plurality of heat radiating fins 4224 for heat radiation protruding therefrom. A stop groove 4234 may be formed on an external surface of the body portion 4304 to extend in a length direction of the body portion 4304 on two sides of the recess portion 4214. The stop groove 4234 may be coupled to the cover unit 4207. At least one end of the body portion 4304 in a length direction thereof may be open. The body portion 4304 may have a pipe shaped structure of which one end is open.

The driving unit 4209 may be provided with the end portion of the body portion 4304 being open in the length direction thereof to supply driving power to the light source module 4203. The driving unit 4209 may include electrode pins 4219 protruding externally.

The cover unit 4207 may be coupled to the body portion 4304 to cover the light source module 4203. The cover unit 4207 may be formed of a material through which light may be transmitted. The cover unit 4207 may have a curved, semicircular surface such that light may be irradiated uniformly, externally. A protrusion 4217 may be formed on a lower surface of the cover unit 4207 coupled to the body portion 4304, to be engaged with the stop groove 4234 of the body portion 4304 in a length direction of the cover unit 4207.

The exemplary embodiment illustrates the case in which the cover unit 4207 has a semicircular structure, but a shape of the cover unit 4207 is not limited thereto, and may be various changed according to an illumination design in connection with irradiation of light. For example, the cover unit 4207 may have a flat quadrangular shape or a polygonal structure.

As set forth above, according to exemplary embodiments, since a compositional ratio of an activator is gradually reduced from a center to a surface of a phosphor, a fluoride phosphor and a light emitting device may have improved reliability, and a method of manufacturing the same may be provided.

While exemplary embodiments have been shown and described above, it will be apparent to those skilled in the art that modifications and variations could be made without departing from the scope of the inventive concept as defined by the appended claims.

What is claimed is:

1. A method of manufacturing a fluoride phosphor, the method comprising:
preparing a first solution comprising a manganese compound and a first raw material comprising M, wherein M is at least one selected from silicon (Si), titanium (Ti), zirconium (Zr), hafnium (Hf), germanium (Ge) and tin (Sn);
forming precipitates by providing, to the first solution that is prepared, a second solution comprising a second raw material comprising A, wherein A is at least one selected from lithium (Li), sodium (Na), potassium (K), rubidium (Rb), and cesium (Cs);
growing the precipitates that are formed, by providing the first raw material to a mixed solution of the first solution and the second solution;
collecting the precipitates that are formed;
preparing a third solution by providing, to the precipitates that are collected, the first raw material and a hydrofluoric acid solution; and
forming fluoride particles by providing the second solution to the third solution that is prepared,
wherein the fluoride phosphor is represented by a formula $A_xMF_y:Mn_z^{4+}$,
wherein a first compositional ratio x of A satisfies $2 \leq x \leq 3$, and
wherein a second compositional ratio y of F satisfies $4 \leq y \leq 7$.

2. The method of claim 1, wherein in the growing of the precipitates, the first raw material reacts with $A^+$ and $Mn^{4+}$ in the mixed solution.

3. The method of claim 1, wherein in the forming of the fluoride particles, the second raw material of the second solution reacts with $Mn^{4+}$ in the third solution.

4. The method of claim 1, wherein the collecting of the precipitates comprises separating the precipitates from $Mn^{4+}$ in a solution comprising the precipitates.

5. The method of claim 1, further comprising:
washing the fluoride particles that are formed; and
providing, to an organic solvent, the fluoride particles that are washed, to allow an organic material to be physically adsorbed onto surfaces of the fluoride particles that are washed.

6. The method of claim 5, wherein a molar ratio of the fluoride particles and the organic material is within a range of 1:1 to 1:1.5.

7. The method of claim 5, wherein the organic material comprises an oleic acid.

8. The method of claim 1, further comprising:
drying the fluoride particles that are formed; and
performing a heat treatment of the fluoride particles that are dried.

9. The method of claim 1, wherein the forming of the precipitates and the fluoride particles comprises providing the second solution to the first solution and the third solution a plurality of times.

10. The method of claim 9, wherein the second solution is provided the plurality of times to sequentially form fluoride seeds, allow the fluoride seeds that are formed to grow, and induce precipitation of the fluoride seeds that are grown.

11. The method of claim 1, wherein a first volume of the first raw material provided in the growing of the precipitates is within a range of about 15% to about 25% of a second volume of the first raw material included in the first solution.

12. The method of claim 1, wherein a first weight of the second raw material included in the second solution provided to the third solution is within a range of about 40% to about 60% of a second weight of the second raw material included in the second solution provided to the first solution.

13. The method of claim 1, wherein the manganese compound comprises a composition of $A_xMnF_y$.

14. The method of claim 1, wherein the first raw material comprises at least one selected from $H_xMF_y$, $A_xMF_y$ and $MO_2$, and
wherein the second raw material comprises $AHF_2$.

15. A method of manufacturing a fluoride phosphor, the method comprising:
preparing a first solution comprising a manganese compound and a first raw material comprising M, wherein M is at least one selected from silicon (Si), titanium (Ti), zirconium (Zr), hafnium (Hf), germanium (Ge) and tin (Sn);
forming fluoride particles by providing, to the first solution that is prepared, a second solution comprising a second raw material comprising A, wherein A is at least one selected from lithium (Li), sodium (Na), potassium (K), rubidium (Rb), and cesium (Cs);
growing the fluoride particles that are formed, by providing the first raw material to a mixed solution of the first solution and the second solution, wherein the first raw material reacts with $A^+$ and $Mn^{4+}$ remaining in the mixed solution;
collecting the fluoride particles that are grown;
preparing a third solution by providing, to the fluoride particles that are collected, the first raw material and a hydrofluoric acid solution; and
growing the fluoride particles to which the first raw material and the hydrofluoric acid solution is provided, by providing the second solution to the third solution that is prepared,
wherein the fluoride particles have a concentration of $Mn^{4+}$ that is gradually reduced while being grown,
wherein the fluoride phosphor is represented by a formula $A_xMF_y:Mn_z^{4+}$,
wherein a first compositional ratio x of A satisfies $2 \leq x \leq 3$, and
wherein a second compositional ratio y of F satisfies $4 \leq y \leq 7$.

16. A method of manufacturing a fluoride phosphor, the method comprising:
preparing a first solution comprising a manganese compound and a first raw material comprising M, wherein M is at least one selected from silicon (Si), titanium (Ti), zirconium (Zr), hafnium (Hf), germanium (Ge) and tin (Sn);
forming precipitates by combining the first solution that is prepared, with a second solution comprising a second raw material comprising A, wherein A is at least one selected from lithium (Li), sodium (Na), potassium (K), rubidium (Rb), and cesium (Cs);
growing the precipitates that are formed, by providing the first raw material to a mixed solution of the first solution and the second solution;
collecting the precipitates that are formed;
preparing a third solution by combining, with the precipitates that are collected, the first raw material and a hydrofluoric acid solution; and
forming fluoride particles by combining the second solution with the third solution that is prepared,
wherein the fluoride phosphor is represented by a formula $A_xMF_y:Mn_z^{4+}$,
wherein a first compositional ratio x of A satisfies $2 \leq x \leq 3$, and
wherein a second compositional ratio y of F satisfies $4 \leq y \leq 7$.

17. The method of claim 16, wherein the first raw material comprises at least one selected from $H_xMF_y$, $A_xMF_y$ and $MO_2$, and
wherein the second raw material comprises $AHF_2$.

18. The method of claim 1, wherein the manganese compound comprises a composition of $A_xMnF_y$.

19. The method of claim 16, further comprising:
washing the fluoride particles that are formed; and
combining, with an organic solvent, the fluoride particles that are washed, so that an organic material is physically adsorbed onto surfaces of the fluoride particles that are washed.

20. The method of claim 16, further comprising:
drying the fluoride particles that are formed; and
performing a heat treatment of the fluoride particles that are dried.

* * * * *